United States Patent
Santhanam et al.

(10) Patent No.: US 11,715,809 B2
(45) Date of Patent: Aug. 1, 2023

(54) SPACE CHARGE TRAP-ASSISTED RECOMBINATION SUPPRESSING LAYER FOR LOW-VOLTAGE DIODE OPERATION

(71) Applicant: The Board of Trustees of the Leland Stanford Junior University, Stanford, CA (US)

(72) Inventors: Parthiban Santhanam, Redwood City, CA (US); Shanhui Fan, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 17/358,980

(22) Filed: Jun. 25, 2021

(65) Prior Publication Data
US 2021/0408318 A1   Dec. 30, 2021

Related U.S. Application Data

(60) Provisional application No. 63/044,317, filed on Jun. 25, 2020.

(51) Int. Cl.
  *H01L 31/109*  (2006.01)
  *H01L 33/00*   (2010.01)
  *H01L 31/072*  (2012.01)
  *H01L 33/06*   (2010.01)
  *H01L 33/14*   (2010.01)

(52) U.S. Cl.
  CPC ......... *H01L 31/109* (2013.01); *H01L 31/072* (2013.01); *H01L 33/002* (2013.01); *H01L 33/06* (2013.01); *H01L 33/14* (2013.01)

(58) Field of Classification Search
  CPC ... H01L 31/109; H01L 31/072; H01L 33/002; H01L 33/06; H01L 33/14
  USPC .......................................................... 257/12
  See application file for complete search history.

(56) References Cited

U.S. PATENT DOCUMENTS

| | | | |
|---|---|---|---|
| 9,557,215 B2* | 1/2017 | Santhanam | F21V 3/02 |
| 10,205,046 B2 | 2/2019 | Santhanam | |
| 2019/0296131 A1* | 9/2019 | Kim | H01L 29/267 |

OTHER PUBLICATIONS

Gray et al., "Design for enhanced thermo-electric pumping in light emitting diodes", 2013, APL v103, 123503.
(Continued)

*Primary Examiner* — Calvin Y Choi
(74) *Attorney, Agent, or Firm* — Lumen Patent Firm

(57) ABSTRACT

Shockley-Read-Hall (SRH) generation and/or recombination in heterojunction devices is suppressed by unconventional doping at or near the heterointerface. The effect of this doping is to shift SRH generation and/or recombination preferentially into the wider band gap material of the heterojunction. This reduces total SRH generation and/or recombination in the device by decreasing the intrinsic carrier concentration $n_i$ at locations where most of the SRH generation and/or recombination occurs. The physical basis for this effect is that the SRH generation and/or recombination rate tends to decrease as $n_i$ around the depletion region decreases, so decreasing the effective $n_i$ in this manner is a way to decrease SRH recombination.

17 Claims, 20 Drawing Sheets

(56) References Cited

OTHER PUBLICATIONS

Xiao, "Optoelectronics for refrigeration and analog circuits for combinatorial optimization", 2019, UC Berkeley dissertation.

\* cited by examiner

FIG. 1A  $\Delta E_C < \Delta E_V$

FIG. 2A  $\Delta E_C > \Delta E_V$

SPACE CHARGE TRAP-ASSISTED RECOMBINATION SUPPRESSING LAYER FOR LOW-VOLTAGE DIODE OPERATION

CROSS REFERENCE TO RELATED APPLICATIONS

This application claims priority from U.S. Provisional Patent Application 63/044,317 filed Jun. 25, 2020, which is incorporated herein by reference.

GOVERNMENT SPONSORSHIP

This invention was made with Government support under contract DE-SC0019140 awarded by the Department of Energy, and under contract DE-SC0001293 awarded by the Department of Energy. The Government has certain rights in the invention.

FIELD OF THE INVENTION

This invention relates to reducing non-radiative recombination and generation of charge carriers in semiconductor devices.

BACKGROUND

In most semiconductor devices and applications, non-radiative recombination and generation are undesirable parasitic effects. One kind of recombination is Shockley-Read-Hall (SRH) recombination, which is the nonradiative recombination of two initially separated charge carriers via one or more trap states; such states are spatially localized around a crystal impurity or other defect and their energy level falls within a band of energies from which electrons are forbidden in perfect crystals. The forbidden band of energies is typically referred to as the band gap of a semiconductor. In most cases, semiconductor devices are designed without taking parasitic SRH generation and/or recombination into account, and in the resulting device designs the SRH generation and/or recombination losses are what they are. Accordingly, it would be an advance in the art to reduce parasitic SRH generation and/or recombination in semiconductor devices.

SUMMARY

In this work, Shockley-Read-Hall (SRH) generation and/or recombination in heterojunction devices is suppressed by unconventional doping at or near the heterointerface. The effect of this doping is to shift SRH generation and/or recombination preferentially into the wider band gap material of the heterojunction. This reduces total SRH generation and/or recombination in the device by decreasing the intrinsic carrier concentration $n_i$ at locations where most of the SRH generation and/or recombination occurs. The physical basis for this effect is that the SRH generation and/or recombination rate tends to decrease as $n_i$ around the depletion region decreases, so decreasing the effective $n_i$ in this manner is a way to decrease SRH generation and/or recombination.

In some embodiments, particularly those exploiting type-II hetero-interfaces near the depletion region, the minority carrier concentration can be reduced by the same principle (even as $n_i$ is not) leading to a reduction in the volume-integrated SRH generation and/or recombination rate in $s^{-1}$. This can lead to the same effect on device performance and constitutes an obvious, minor extension of the principle.

For a $p^+$-n heterojunction with p being the wide gap material and n being the narrow gap material, an exemplary doping to accomplish the above is reduced p doping and increased n doping in two thin (e.g., about 20 nm thick) layers right at the heterointerface. Here the $p^+$-n structure becomes $p^+$-p-$n^+$-n where the bolded layers are the new doping layers.

Similarly, an $n^+$-p heterojunction with n being the wide gap material and p being the narrow gap material could be doped $n^+$-n-$p^+$-p to suppress SRH generation and/or recombination, where the bolded layers are the new doping layers.

The above examples refer to piecewise-continuous doping profiles, but in practice the broader design space of all inhomogeneous doping profiles is able to improve device performance.

The method of device performance enhancement encompasses other modifications of the design within a <100 nm wide region around the center of the depletion region. Examples include, but are not limited to, the following:
 (a) Use of an intrinsic (i.e. Un-Intentionally-Doped) layer.
 (b) The use of a third bandgap, either wider than the wider bandgap as defined prior to design modification, or intermediate to the narrower and wider bandgaps.
 (c) The use of a type-II heterojunction.
 (d) Compositionally graded layers within which the primary alloy, bandgap, and work function are continuously varied.

This work provides a method of epitaxial growth of semiconductor diodes and an apparatus having a III-V semiconductor double hetero-junction diode capable of either converting incident radiation to electrical power (or an electrical signal) or emitting optical power driven by electricity, including but not limited to in the electro-luminescent refrigeration "LED cooling" regime.

Applications include: 1) Improved open-circuit voltage and efficiency of single- and multi-junction photo-voltaic cells, thermo-photo-voltaic cells, and thermo-radiative cells; 2) Improved light-emitting diode electrical-to-optical power conversion efficiency; 3) Improved detectivity, noise-equivalent power, thermal performance, power consumption, and sensitivity of photo-diode detectors; 4) Potential exists for a new photonic heat transfer technology which could be of value in the thermal management of handheld mobile devices (i.e. phones, tablets, smart watches) and Low Earth Orbital satellites.

Significant advantages are provided, including: 1) Improvements to the efficiency of solar cells and thermo-photo-voltaic devices in dim illumination conditions; 2) Improvements to the efficiency of light-emitting diodes used for solid state lighting and other applications; 3) Reduced dark current noise in avalanche photo-diodes employed in LiDaR and other technologies.

BRIEF DESCRIPTION OF THE DRAWINGS

FIGS. 1A-C schematically show a first embodiment of the invention.

FIGS. 2A-C schematically show a second embodiment of the invention.

DETAILED DESCRIPTION

A) General Principles

Figure 1B:
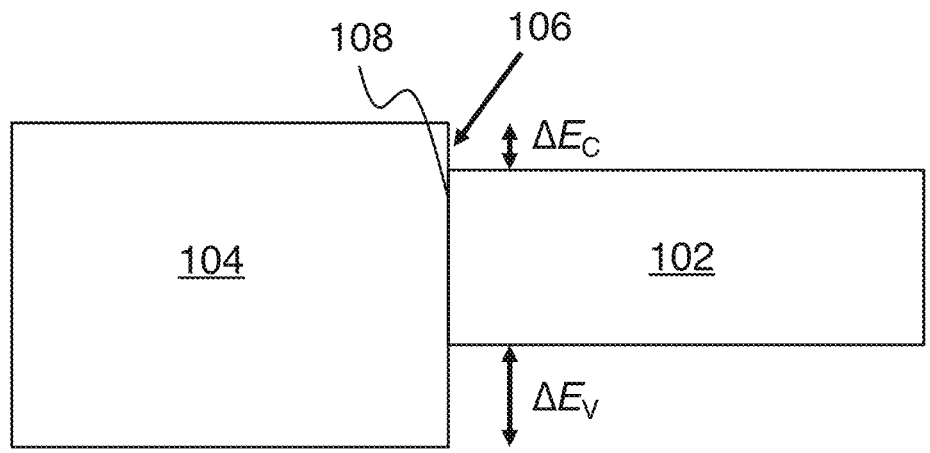
Figure 1B:
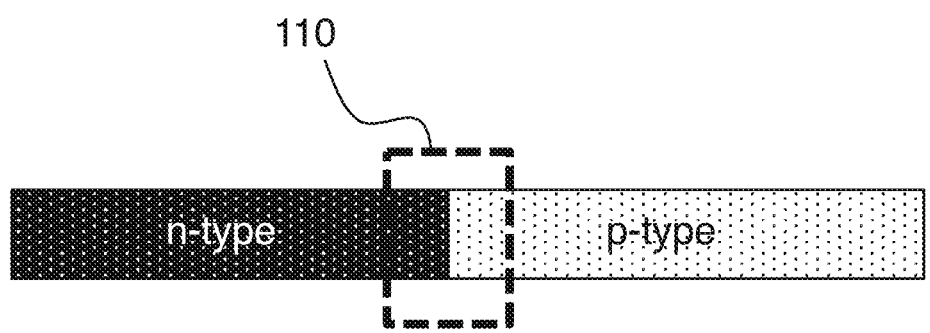
Figure 1C:
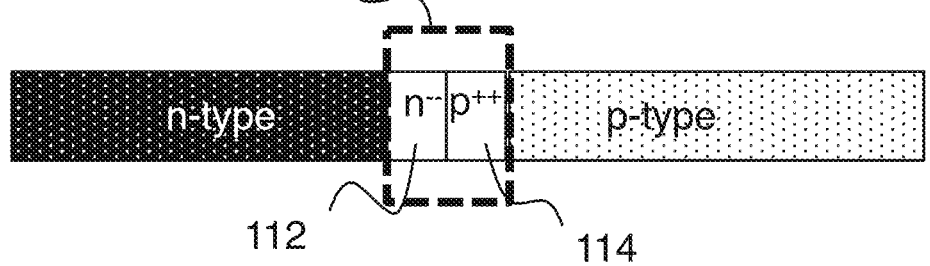

FIGS. 1A-C schematically show a first embodiment of the invention. FIG. 1A is a band diagram showing a first semiconductor material 102 and a second semiconductor material 104 having a larger band gap than the first semiconductor material. A heterojunction 106 is formed at a composition interface 108 between the first semiconductor material 102 and the second semiconductor material 104. FIG. 1B shows a doping profile corresponding to the band diagram of FIG. 1A. Here dopant impurities are present at or near the composition interface 108 to create a p-n junction having a doping interface. The doping profile 110 of the dopant impurities at or near the composition interface is configured to preferentially shift Shockley-Read-Hall (SRH) generation and/or recombination into the second semiconductor material.

The composition interface of a heterojunction is the interface where material composition changes in a heterojunction. The doping interface of a doped heterojunction having a p-n junction is the location in the structure where (nominally) p-type doping becomes n-type (or vice versa). Thus a doping interface location can be defined even if the doping profile is graded at the location of the doping interface.

FIG. 1C shows an example of a doping profile that preferentially shifts SRH generation and/or recombination into the second semiconductor material. Here doping profile 110 includes a first region 114 of the first material 102 at or near the composition interface 108 and having a larger doping concentration than an adjacent part of the first material (e.g., $p^{++}$ vs. p-type doping). The thickness of the first region 114 is preferably 50 nm or less. Here $n^{++}$ and $p^{++}$ doping are defined as doping concentrations of 1e18 $cm^{-3}$ or more, and $n^{--}$ and $p^{--}$ doping are defined as doping concentrations of 1e17 $cm^{-3}$ or less. Practice of the invention does not depend critically on the doping profile away from the heterojunction.

Doping profile 110 can also include a second region 112 of the second material 104 at or near the composition interface 108 and having a smaller doping concentration than an adjacent part of the second material (e.g., $n^{--}$ vs. n-type doping). The thickness of the second region 112 is preferably 200 nm or less. Although the example of FIG. 1C shows inclusion of both regions 112 and 114, the presence of either region alone can suffice. Practice of the invention is also not limited to regions in doping profile 110 having nominally uniform doping. Any inhomogeneous doping profile 110 that shifts the SRH generation and/or recombination into the wider-gap material is suitable.

In the example of FIGS. 1A-C the conduction band discontinuity of the heterojunction ($\Delta E_c$) is less than the valence band discontinuity of the heterojunction ($\Delta E_v$). In such cases it is preferred for the second material 104 to be doped n-type and for the first material 102 to be doped p-type, as shown on FIGS. 1B-C. Here conduction band and valence band discontinuities $\Delta E_c$ and $\Delta E_v$ in a heterojunction are defined as positive quantities equal to the absolute values of the discontinuities in the relevant bands across a heterojunction.

Figure 2B:
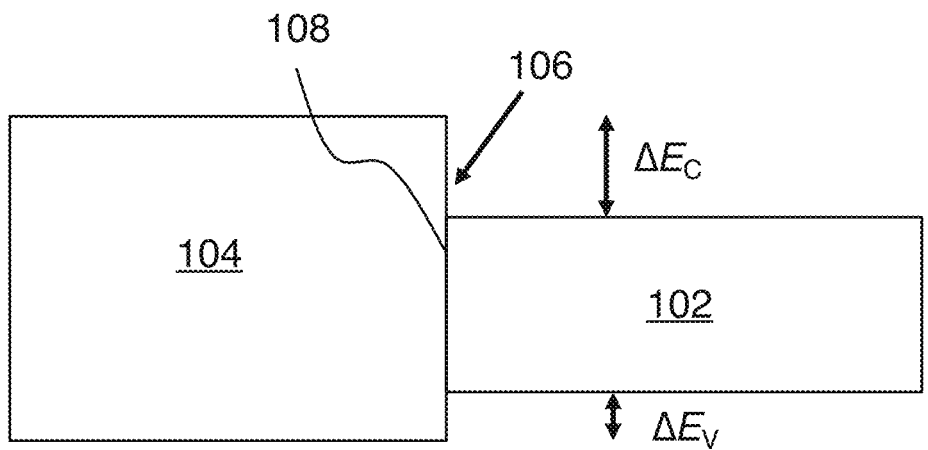
Figure 2B:
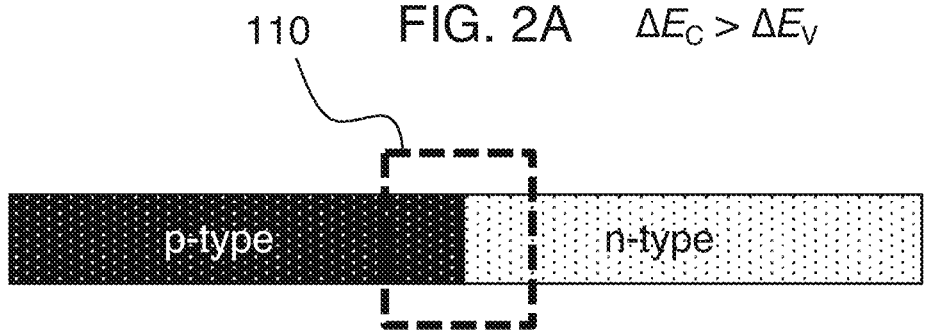
Figure 2C:
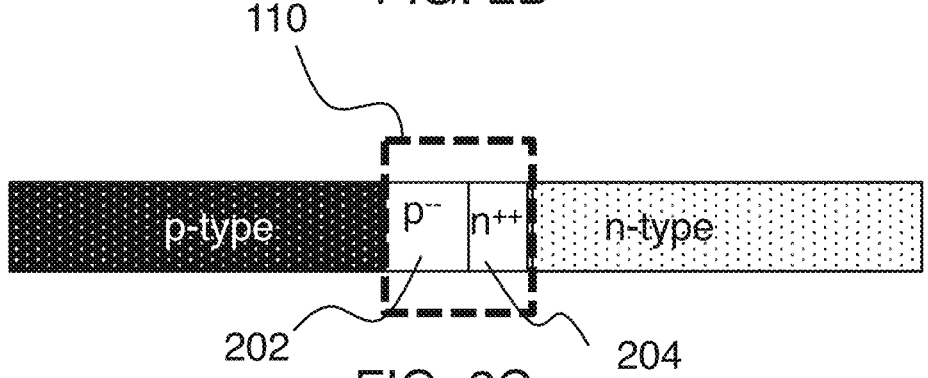

FIGS. 2A-C schematically show a second embodiment of the invention. The example of FIGS. 2A-C is similar to the example of FIGS. 1A-C except that $\Delta E_c$ is greater than $\Delta E_v$. In such cases it is preferred for the second material 104 to be doped p-type and for the first material 102 to be doped p-type, as shown on FIGS. 2B-C.

Another difference between the examples of FIGS. 1A-C and FIGS. 2A-C is that on FIGS. 1A-C the doping interface between regions 112 and 114 coincides with the composition interface 108. On FIGS. 2A-C the doping interface between regions 202 and 204 is separated from the composition interface 108. In cases where these interfaces are separated, the separation is preferably 100 nm or less.

Figure 3:
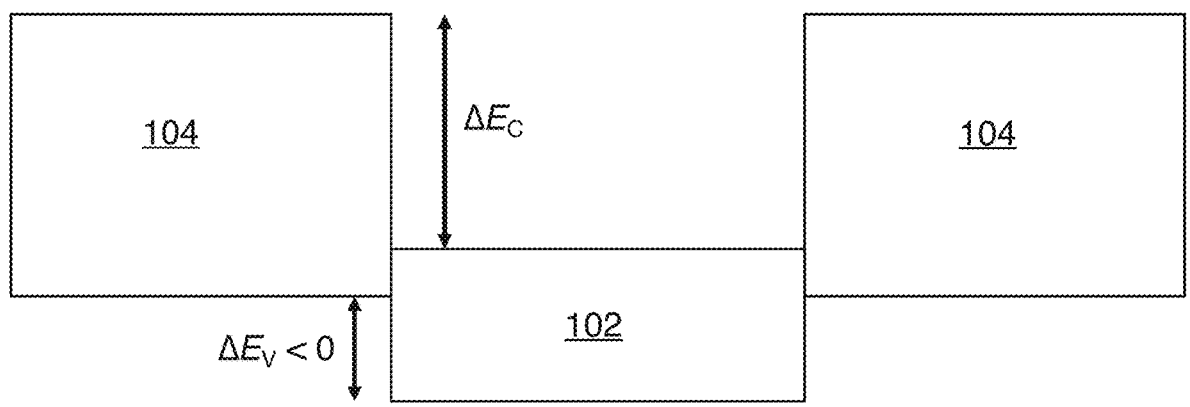
FIG. 3 schematically shows a type II heterostructure.

The examples of FIGS. 1A-C and 2A-C relate to type-I heterojunctions. In a type I heterojunction, the conduction band of the narrow gap material is below the conduction band of the wide gap material, and the valence band of the narrow gap material is above the valence band of the wide gap material. A type II heterojunction is any heterojunction that does not meet the conditions to be type I. FIG. 3 schematically shows an exemplary type II heterostructure. Reduction of SRH generation and/or recombination using doping as described above can be done in both type-I and type-II heterojunctions.

Reduction of SRH generation and/or recombination as described above is expected to be useful in a wide variety of devices and applications. Examples include: 1) A light emitting diode where the band gap of the narrow-gap material is in a range from 0.7 eV to 5 eV; 2) A solar photovoltaic device where the band gap of the narrow-gap material is in a range from 1.1 eV to 1.9 eV; 3) A thermophotovoltaic device where the band gap of the narrow-gap material is in a range from 0.5 eV to 1.45 eV; and 4) A photodetector where the band gap of the narrow-gap material is in a range from 0.5 eV to 1.2 eV.

It is usually preferred for these devices to be diodes operated at a relatively low forward bias range from $V_{gap}/2$ to $V_{gap}-3V_{thermal}$, where $V_{gap}$ is the voltage corresponding to the energy band gap of the first semiconductor material (i.e., of the narrow-gap material of a heterojunction) and $V_{thermal}$ is the thermal voltage. We have $V_{thermal}=kT/q$ where k is Boltzmann's constant, T is absolute temperature and q is the electron charge. At room temperature, $V_{thermal}$ is roughly 26 mV.

B) Simulation Examples

B1) Introduction

Optoelectronic devices have become pervasive in a wide array of technology domains including energy (e.g. PV solar cells, solid-state lighting LEDs), communications (e.g. sources, modulators, and detectors for fiber and free-space optical communication), and imaging (e.g. CMOS sensors, infrared Focal Plane Arrays), and are expanding their reach into new domains like computation (e.g. photonic interconnects). As a result, the performance that these devices achieve has a broad impact on society. In this section we use 1D numerical electron transport models to show a general design principle that can improve the performance of LEDs, photovoltaic cells (PVs), and photo-diode detectors (PDs), providing a conceptual template for incorporating these ideas into new designs in the device classes mentioned above.

Many optoelectronic devices, including LEDs and PV cells, require the maintenance of non-equilibrium electron and hole populations that interact primarily with photons of energy $\hbar \omega$ greater than the bandgap $E_{gap}$ of an active device layer. Non-radiative processes (i.e. processes by which energy flows between the electron-hole subsystem and a subsystem other than the photon field, for example the lattice vibration phonon field) in general serve as parasitics, reducing the efficiency or other performance parameters. Thus a general strategy for designing devices to minimize these interactions can positively impact performance. In this work we present such a strategy and show its potential in LEDs, PVs, and PDs.

B2) Baseline Device Model and Depletion Region SRH Recombination

We begin by modeling charge carrier transport in "baseline" devices that are characteristic of conventional epitaxial layer stack designs for near-infrared double-heterojunction (DHJ) light-emitting and light-absorbing devices without quantum wells with the aim of modifying them to illustrate a design principle. Our baseline devices are DHJ p-n diodes composed of materials commonly grown on Indium Phosphide substrates.

For the primary emitting (or absorbing) layer, we use a GaInAsP alloy that is lattice matched to InP with a 0.93-eV room temperature bandgap; equivalently, it exhibits luminescence at a free space wavelength of $\lambda \approx 1330$ nm. The band offsets used here assume that a fixed percentage of the bandgap change occurs in each of the conduction and valence bands; we use the median of three experimental reports from the literature to estimate the conduction band fraction $\Delta E_C/\Delta E_{gap}=36\%$ with the heterointerface having a Type I character. The approximate alloy composition is $Ga_xIn_{1-x}As_{1-y}P_y$ with $x \approx 0.281$ and $y \approx 0.385$, but our model takes the bandgap and band offsets as direct inputs.

Throughout this section we refer to the ionized dopant impurity concentration as simply the dopant concentration, or equivalently we assume the ionization fraction of dopant impurities is unity. We utilize the package's (SimWindows 1.5.0) built-in framework for Fermi-Dirac statistics and intra-band tunneling, which have minor impacts on transport in heavily doped regions and at heterointerfaces with large band offsets respectively.

We consider two baseline designs, one for an LED (Table 1) and one for a PV cell (Table 2). The baseline LED device has an n-type emitting layer; the baseline PV device has a p-type absorbing layer. The LED doping is chosen as n-type for nominally the same reasons that this was the choice made in previously reported experiments. The PV doping is chosen as p-type nominally because the higher mobility of electrons allows for longer diffusion lengths under our assumption of symmetric electron and hole SRH lifetimes. The primary value of these choices, however, is to illustrate that the design principle can be applied to either the case of an n-type or a p-type narrow bandgap layer.

TABLE 1

Layer stack for the baseline LED.
LAYER STACK FOR BASELINE LED STRUCTURE

| Layer # | Thickness (nm) | Material | Doping $|N_D-N_A|$ (cm$^{-3}$) |
|---|---|---|---|
| 5 | 480 | p-InP | $1 \times 10^{18}$ |
| 4 | 20 | p-InP | $1 \times 10^{18}$ |
| 3 | 20 | n-GaInAsP | $4 \times 10^{17}$ |
| 2 | 980 | n-GaInAsP | $4 \times 10^{17}$ |
| 1 | 1300 | n-InP | $1 \times 10^{18}$ |

TABLE 2

Layer stack for the baseline PV and PD.
LAYER STACK FOR BASELINE PV AND PD STRUCTURE

| Layer # | Thickness (nm) | Material | Doping $|N_D-N_A|$ (cm$^{-3}$) |
|---|---|---|---|
| 5 | 500 | p-InP | $2 \times 10^{18}$ |
| 4 | 980 | p-GaInAsP | $2 \times 10^{18}$ |
| 3 | 20 | p-GaInAsP | $2 \times 10^{18}$ |
| 2 | 40 | n-InP | $2 \times 10^{18}$ |
| 1 | 460 | n-InP | $2 \times 10^{18}$ |

Our numerical model is an electron transport solver that implements the drift-diffusion equations in one dimension. The code package, SimWindows 1.5.0, was originally written in 1994 by David Wells Winston and is freely distributed on the Internet. Our model includes three types of recombination: (1) trap-assisted SRH recombination that we take as purely non-radiative; (2) bimolecular radiative recombination; and (3) non-radiative Auger recombination. In Section B5, where we analyze a PD that may operate at reverse bias, the presence of an SRH generation process is also relevant. The following equation implements both the SRH generation and recombination processes, with the first term of the numerator (pn) corresponding to carrier recombination and the second ($n_i^2$) corresponding to carrier generation. The net recombination (i.e. recombination minus generation) $R_{SRH}$ is given by:

$$R_{SRH} = \frac{np - n_i^2}{\tau_p(n+n_1) + \tau_n(p+p_1)} = \frac{np - n_i^2}{\tau(n+p+2n_i)} \quad (1)$$

where n and p are the local electron and hole concentrations, $n_i$ is the local intrinsic carrier concentration, $\tau_p$ and $\tau_n$ are the hole and electron SRH lifetimes, and $n_1$ and $p_1$ are the electron and hole concentrations when the Fermi level matches exactly the trap state energy. The second equality of Equation (1) holds only because of the following assumptions we make: (1) all trap states are at the intrinsic energy level (approximately 40 meV above the middle of the bandgap); (2) the electron and hole lifetimes are symmetric and $\tau_p=\tau_n=\tau$. We assume $\tau=10$ ns unless otherwise stated.

The results presented in this work are most impactful at voltages lower than where today's LEDs are typically designed to operate: $qV<E_{gap}-8 k_BT \approx E_{gap}-200$ meV. As we will discuss in Section B3.1, this voltage range is of relevance to LED refrigeration (i.e. ELC: electroluminescent cooling, thermophotonic cooling) because it allows the cooling effect to persist in the presence of parasitic effects that are difficult to avoid in practice. The voltage range is also of relevance to PVs with low open-circuit voltages; these conditions may be caused by limited illumination in a thermo-photo-voltaic (TPV) configuration or the use of low cost substrates that result in high defect density epitaxy. Due to the latter, the design principle presented here may lead the way to more defect-tolerant PV cells.

At low forward bias voltages, SRH recombination in the non-neutral depletion region is often the dominant non-radiative process. This process is the target of our design strategy, and thus we focus on the electrostatics and charge transport in the region surrounding the p-n heterojunction.

Figure 4A:
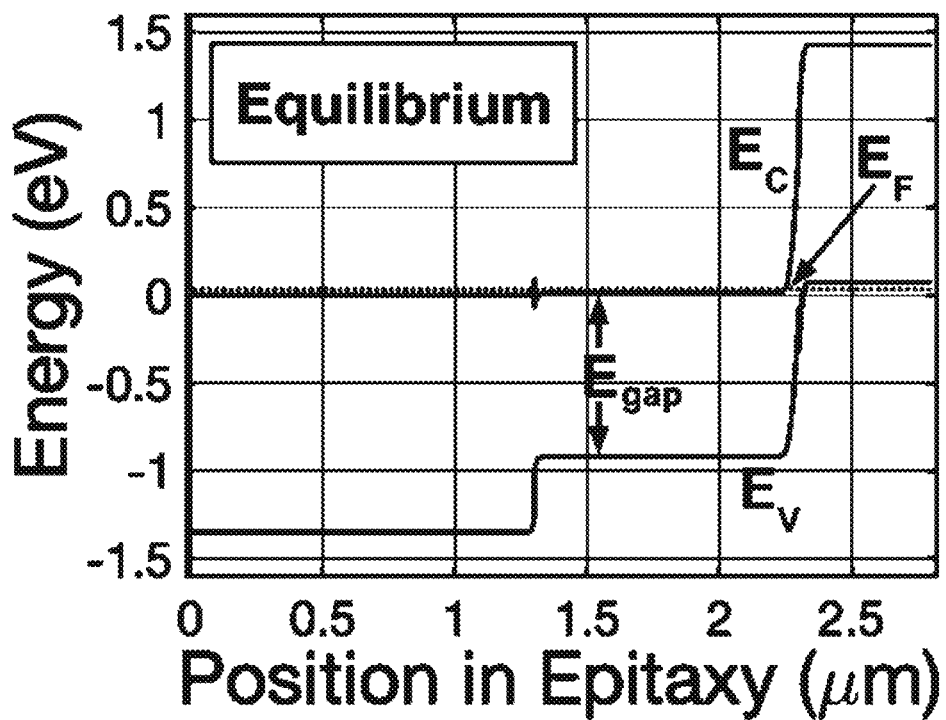
FIGS. 4A-B are exemplary LED band diagrams.
Figure 4B:
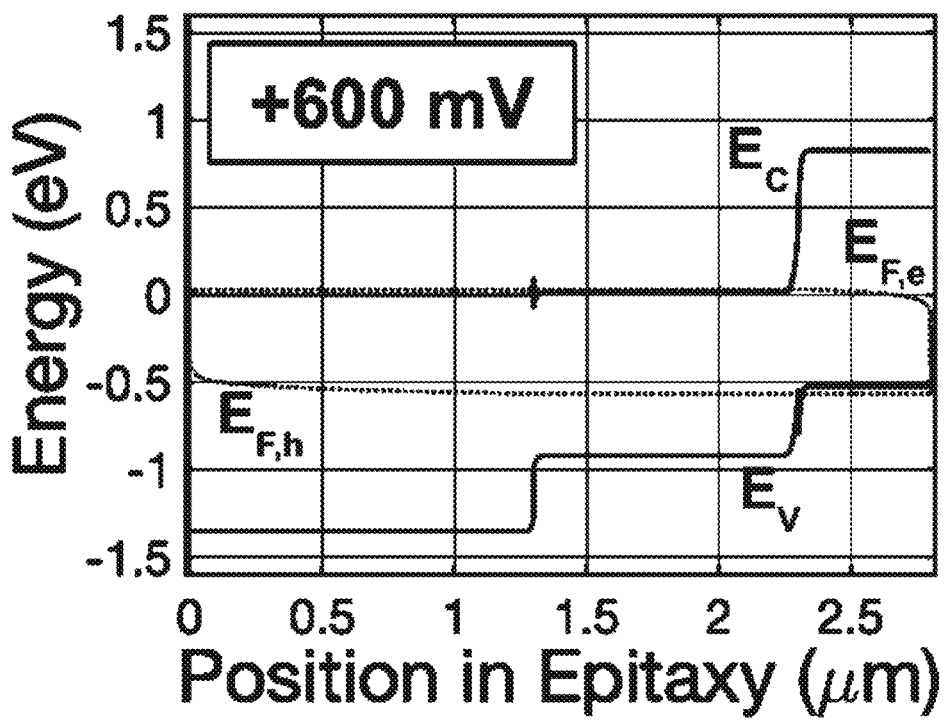

FIGS. 4A-B show the band diagrams for the baseline LED device from Table 1, both at equilibrium (FIG. 4A) and at a moderate forward bias voltage of +600 mV (FIG. 4B). The bandgap of the photon-emitting layer is $E_{gap} \approx 930$ meV, which corresponds to a free-space wavelength $\lambda \approx 1330$ nm. The difference between the bandgap energy $E_{gap}$ and the quasi-Fermi level separation $E_{F,e} - E_{F,h}$ in FIG. 4B is in the typical operating range of LEDs designed for thermophotonic refrigeration.

Figure 5A:
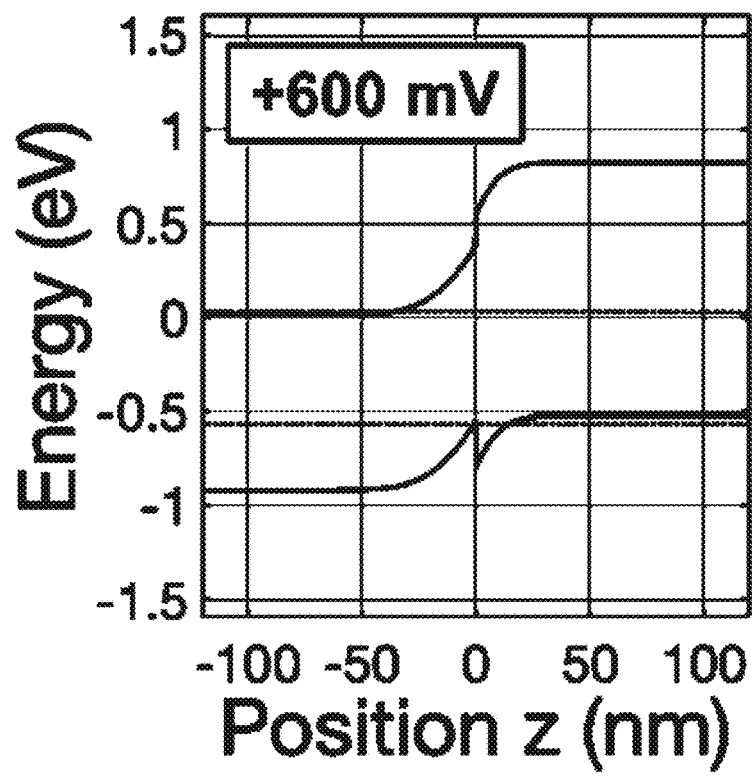
FIGS. 5A-C show exemplary band structure, carrier concentration and recombination rates.
Figure 5B:
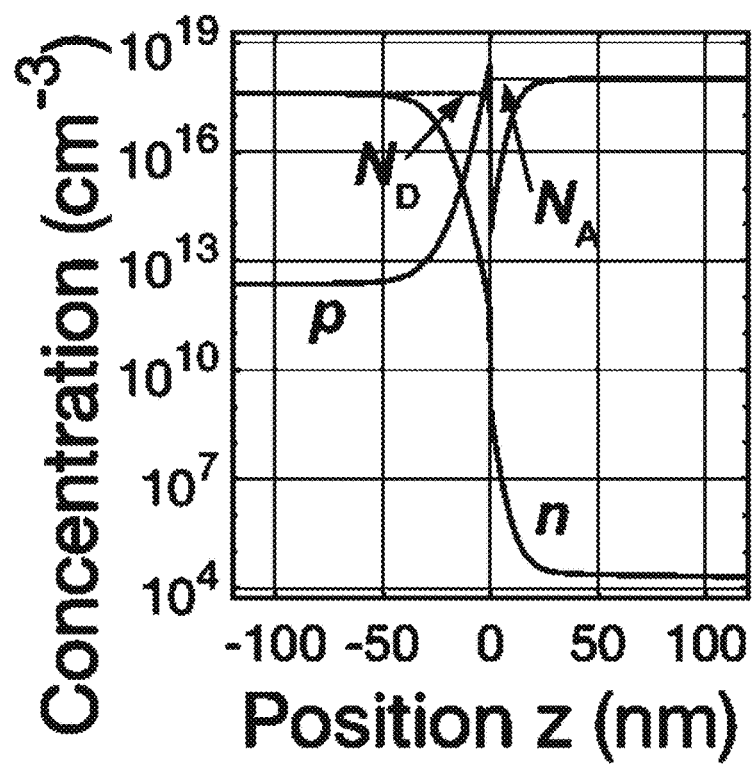
Figure 5C:
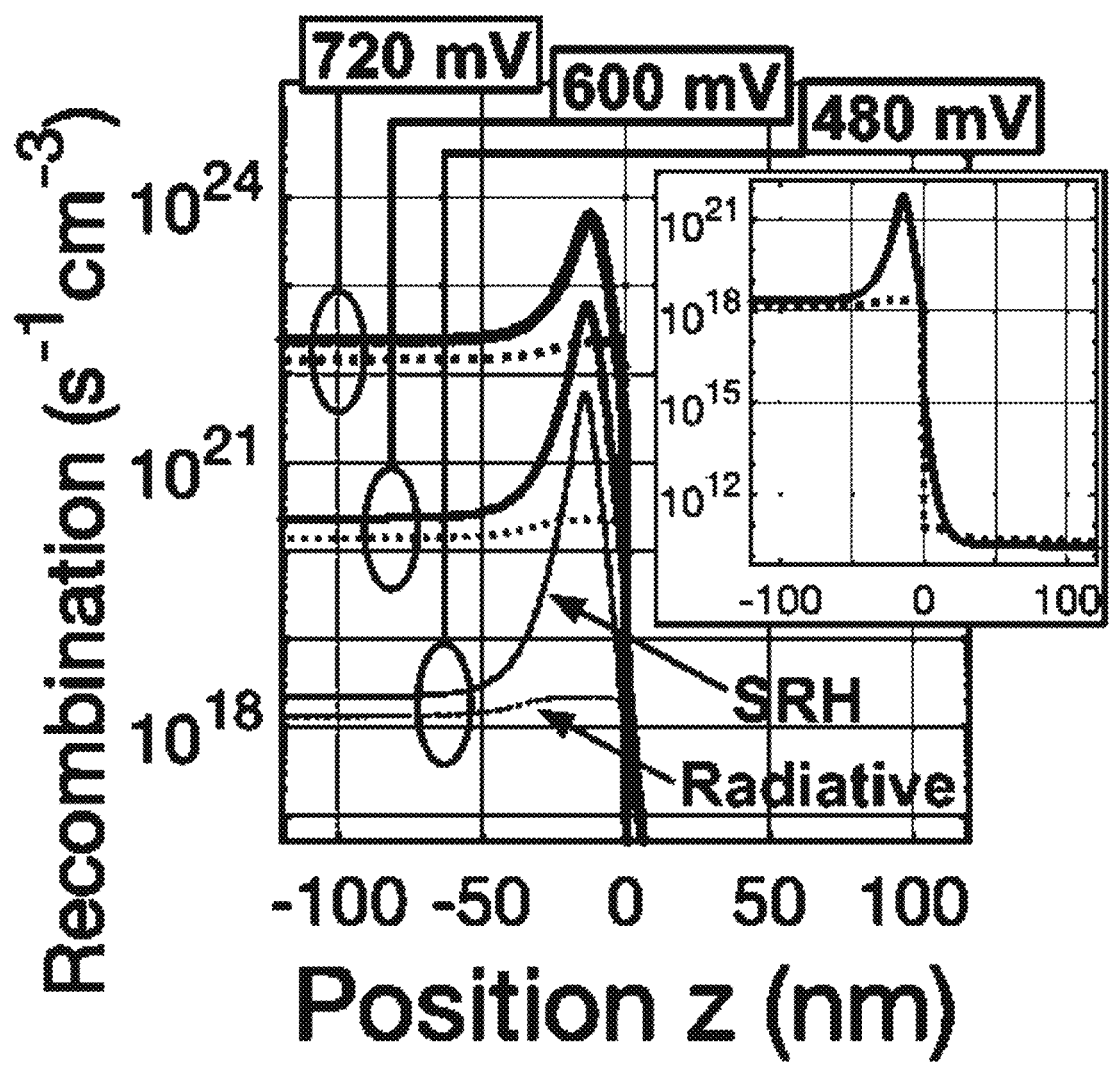

FIGS. 5A-C show features of the baseline LED device model near the p-n junction co-located with a heterojunction. FIG. 5A and FIG. 5B are at +600 mV of forward bias. FIG. 5C shows the spatial distribution of SRH and radiative recombination processes at three voltages spaced by 120 mV; the inset shows the 480 mV curves across a wider dynamic range to clarify that recombination is not zero at z>0.

FIG. 5A shows the same band diagram at +600 mV from FIG. 4B, but zoomed in spatially and centered around the p-n heterojunction shown at the "position in epitaxy" of 2.3 μm in FIGS. 4A-B. For the remainder of this section, we take this point to be the zero of our coordinate system. That is to say, we define the position z such that z=0 at the p-n heterojunction and z>0 is p-type. Note that for the LED, z>0 is the wide bandgap material while z>0 is the narrow bandgap material for the PV device. FIG. 5B depicts the device's electrostatic charge distribution, including the donor and acceptor profiles, in the same 240 nm-wide window around the p-n heterojunction. FIG. 5C shows the rates of electron-hole recombination which lead to forward current through the diode as a function of position in the same window. Note that we have omitted the Auger term, as it is many orders of magnitude below the others at the voltages under consideration.

Due to the strength of the built-in electric field in this region and our assumptions about the trap spectrum, the local maxima seen on FIG. 5C are fairly sharp. At low voltages, a field strength of order $10^7$ V/m is typical. In this case we may use the room temperature rule of thumb of 60 meV/decade for the exponential decay of the concentration of electrons and holes as a function of energy in the Boltzmann limit at $\approx 300$ K to quantify this sharpness. For the assumed field strength, a plane just 6 nanometers away from the active trap plane would necessarily have one of either n or p a full 10× larger than at the SRH local maximum. Since both n and p enter the denominator additively in Equation (1), this indicates that $\approx 99\%$ of the integrated recombination takes place within a 25 nm window. For the admittedly unphysical case of a delta function trap spectrum, more than half of the recombination falls inside a window of width 50 Å.

The recombination profile in FIG. 5C illustrates that the rate of SRH recombination has a peak in the depletion region. As we will presently explain, from the voltage dependence of this peak, one can deduce that this peak is responsible for the SRH process's ideality factor 2 contribution to current density; this contribution is often denoted $J_{02}$ because it is both a contribution to saturation current (denoted $J_0$ in the ideal diode equation) and scales with voltage as $\exp(qV/(2k_BT))$.

At 300 Kelvin, processes that scale with voltage as simply $\exp(qV/k_BT)$ speed up by a factor of 10 each time the voltage is raised by $\approx 60$ mV. However, for processes with an ideality factor of 2, $\approx 120$ mV of additional voltage are required to produce the same 10-fold rate increase. In FIG. 5C, recombination profiles are shown for three voltages separated by 120 mV each. Since each 120 mV change produces a 100× change for the low-injection SRH recombination in quasi-neutral regions and radiative recombination, these processes scale as $\exp(qV/k_BT)$ and are not responsible for the $J_{02}$ current. In contrast, the spatial peak of the SRH rate located $\approx 12$ nm to the left of the heterojunction changes by only 10× when $\Delta V=120$ mV and is responsible for the $J_{02}$ current. As the bias is decreased, the relative impact of depletion region SRH increases and becomes the primary non-radiative pathway and thus the primary parasitic for the LED which prevents it from achieving net refrigeration. The situation for the PV is similar; in our model depletion region SRH is the primary process limiting cell efficiency in situations where the open-circuit voltage is low relative to the bandgap.

In this work we manipulate the doping profile in the vicinity of the depleted p-n heterojunction. This degree of freedom can be easily controlled in several common epitaxial growth techniques, including Molecular Beam Epitaxy (MBE) and Chemical Vapor Deposition (CVD), although the degree of control may be limited by dopant diffusion both during and after growth.

The essence of our strategy is to limit the $J_{02}$ current by displacing the plane at which the trap states are most active (i.e. the peak in FIG. 5C). In the model based on Equation (1), this plane coincides with the mid-gap energy crossing the trap level. The numerator of Equation (1) is proportional to $n_i^2$; in Section B3 we will find that local SRH recombination rate density $R_{SRH}$ at this plane is in fact proportional to $n_i$. By displacing this plane into the wider bandgap side of the heterojunction, the rate is thus reduced in proportion to $n_i$, meaning it is reduced exponentially in the ratio of the bandgap difference to $2 k_BT$. In our case, the reduction caused by displacing the peak from the GaInAsP to the InP is more than 3 orders of magnitude. The impact on device efficiencies at low voltages is thus expected to be substantial.

B3) Light Emitting Diodes for Thermophotonic Refrigeration

B3.1) Motivation

In order for an LED to produce a net refrigerating effect, it must have a sufficiently high external quantum efficiency (EQE); here the EQE is defined as the ratio of electrons (i.e. charge quanta) that pass through it as current which are successfully converted into photons (i.e. optical quanta) that fully escape it. Specifically the EQE must exceed the ratio of the bias voltage, qV, to the mean energy of the emitted photons ($\hbar\omega$), the latter being well approximated by the bandgap $E_{gap}$ for the devices under consideration here. Although the preceding statement was interpreted as a requirement for near-unity EQE for several decades, there is no strict lower bound to the EQE for cooling; rather there is a soft but significant cooling power penalty for satisfying this requirement on EQE and $qV/E_{gap}$ with lower values of both. For example, prior work in the literature has exploited, in its extreme form, the fact that this relation may be satisfied when both $qV/E_{gap}$ and EQE are extremely small, $O(10^{-4})$;

it did so at the cost of an extremely low cooling power density, O(nW/cm²), making even the measurement of any temperature deflection, let alone a useful cooling effect, an experimental challenge that remains unrealized.

Meanwhile attempts to satisfy the requirement at higher voltage and higher quantum efficiency have faced such stringent demands that experimental evidence of a temperature deflection from these systems also remains unrealized. The primary hurdle faced by experiments to date have been the need for very high EQE, which itself can be limited by either the IQE or the efficiency with which the light is extracted. In one report the authors worked to address the Light Extraction Efficiency (LEE=EQE/IQE) component and achieved an impressive 94%, though it is worth noting that this figure was expected to be larger than for other experiments because their GaN-to-air index contrast was 2.5:1 rather than the 3-3.3:1 typical of GaInAsP-based LEDs. With a maximum possible EQE of 94%, however, these experiments were clearly short of the necessary $qV/\langle\hbar\omega\rangle \geq 97\%$ at the voltage of peak EQE. In other work, measurements indicated that the removal of a non-fundamental series resistance contribution and a justifiable correction for the imperfect responsivity of the detector would result in an EQE>$qV/\langle\hbar\omega\rangle$ and thus support net cooling. However the basic design of the experiment separates the emitter and absorber by just a micron-scale film with $O(10^{-3}$ K/(W/cm²)) of thermal impedance between the two, again making the thermal deflection from any cooling challenging to measure directly. This low thermal impedance is not merely incidental, but in fact critical to the EQE, as the problem of light extraction faces essentially no index contrast, allowing the EQE to remain tolerant to lower IQE values than would a similar device with vacuum-based thermal isolation.

In this work we present a path toward realization of an unequivocal temperature deflection measurement that targets operating voltages in an intermediate range relative to prior experiments. This range has been previously neglected because IQE has been severely limited by the presence of non-radiative recombination at voltages $qV < E_{gap} - 8 k_B T \approx E_{gap} - 200$ meV.

As has been established in the literature, moderate doping of the emitting layer can significantly reduce the SRH recombination here at low voltages. This feature has often been incorporated explicitly into the design. Even when it has not been, however, the background doping created unintentionally during epitaxial growth (more so in CVD than in MBE) is sufficient to serve this purpose at $qV < E_{gap} - $(a few hundred meV). For a doped emitting layer, bulk SRH recombination contributes with ideality factor 1 for voltages where the device is in low injection. For the scale of low injection, one may consider GaAs; here an unintentional background doping of just $N_D$ or $N_A = 1e15$ cm$^{-3}$ would eliminate bulk SRH as a contribution to ideality factor 2 current for voltages V<1 Volt. As a result, a simple A-B-C model that neglects the spatial dependence of SRH recombination, when applied to a GaAs LED with an emitter layer doping of 1e15 cm$^{-3}$ or more, would find no ideality factor 2 in the A term (i.e. the SRH contribution) for V<1 Volt.

Nevertheless, an ideality factor 2 contribution has been visible in all experiments to date. We conclude, therefore, that a simple A-B-C model without spatial dependence is insufficient. To address this issue we have implemented a one-dimensional electron transport model. Our model shows that SRH recombination at low voltage is highly concentrated at the depletion region. Abating this depletion region SRH recombination is the goal of our designs, three qualitative illustrations of which appear in Figures FIGS. 6A-C, and a fuller quantitative analysis of which appears in Section B3.2.

Figure 6A:
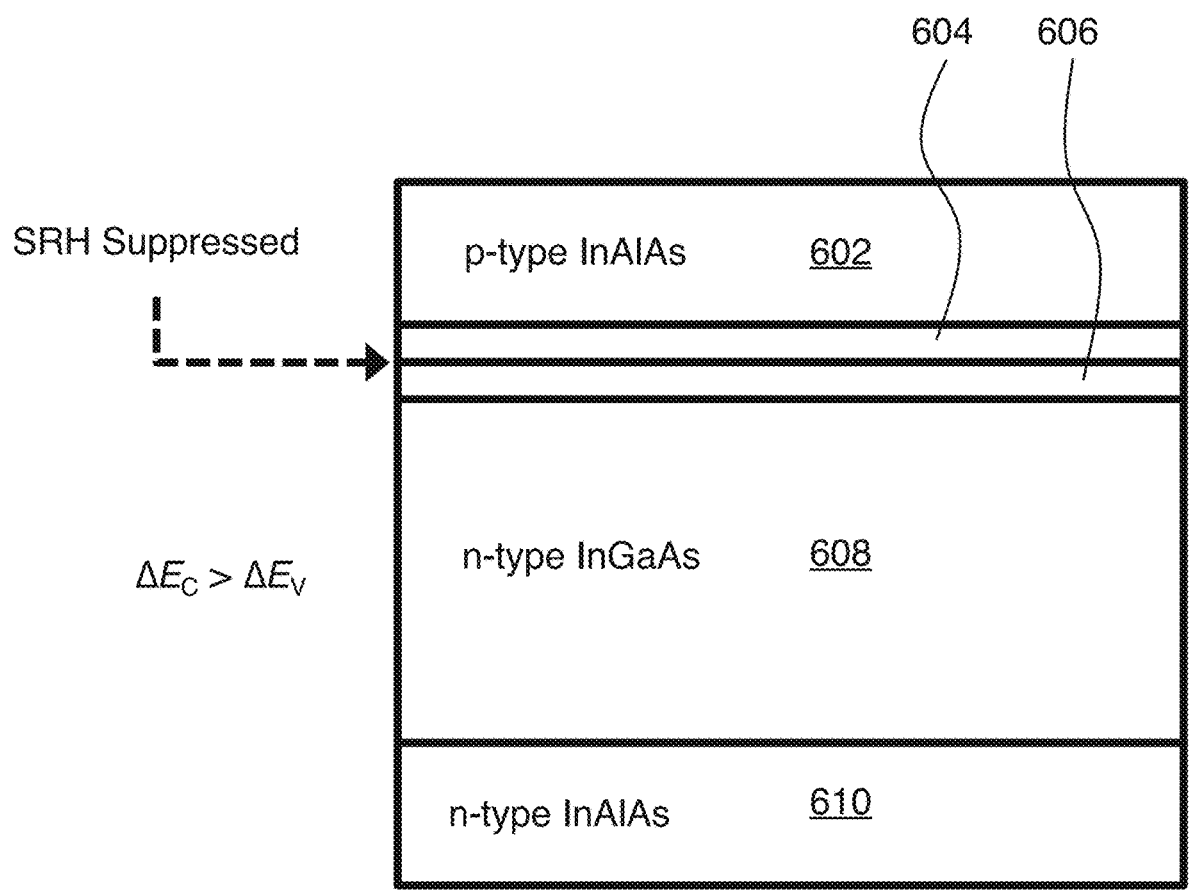
FIGS. 6A-C show exemplary LED layer structures relating to embodiments of the invention.

The example of FIG. 6A is an InGaAs/InAlAs LED layer structure. Here 602 is p-type InAlAs, 604 is p$^{--}$ InAlAs, 606 is n$^{++}$ InGaAs, 608 is n-type InGaAs (bandgap 0.74 eV, lattice matched to the InAlAs), and 610 is n-type InAlAs. In this example, doping regions 604 and 606 provide reduced SRH recombination.

Figure 6B:
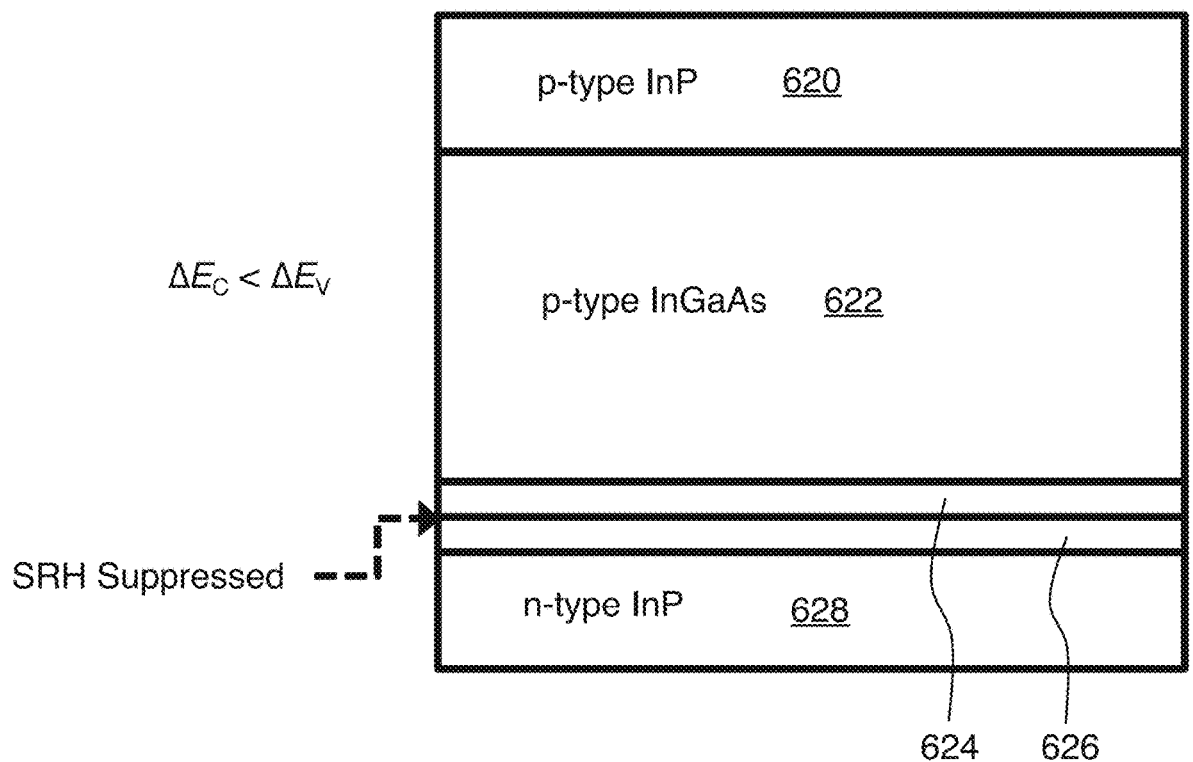

The example of FIG. 6B is an InGaAs/InP LED layer structure. Here 620 is p-type InP, 622 is p-type InGaAs (bandgap 0.74 eV, lattice matched to InP), 624 is p$^{++}$ InGaAs, 626 is n$^{--}$ InP, and 628 is n-type InP. In this example, doping regions 624 and 626 provide reduced SRH recombination.

Figure 6C:
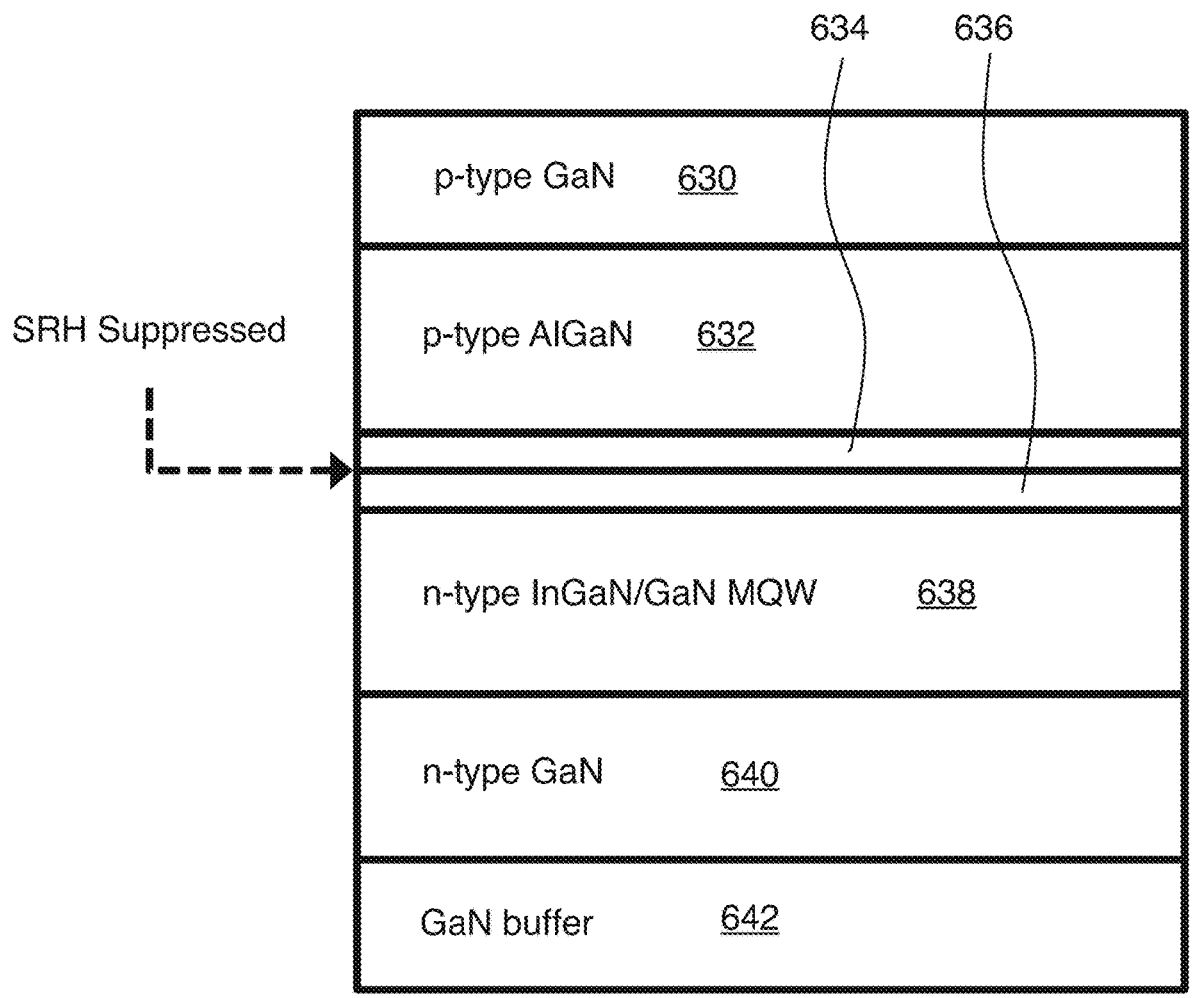

The example of FIG. 6C is an InGaN/AlGaN LED layer structure. Here 630 is p-type GaN, 632 is a p-type AlGaN electron blocking layer, 634 is p$^{--}$ AlGaN, 636 is n$^{++}$ GaN, 638 is an n-type MQW (multiple quantum well region) having GaN barriers and InGaN quantum wells, 640 is n-type GaN and 642 is an GaN buffer. In this example, doping regions 634 and 636 provide reduced SRH recombination.

If successful, reducing this contribution should reduce the $J_{02}$ non-radiative current contribution and open the door for LED refrigeration demonstrations at lower voltages $qV < E_{gap} - 8 k_B T \approx E_{gap} - 200$ meV, where the minimum EQE for refrigeration is much more tolerant to the many non-fundamental parasitics that arise in any real experiment.

We note also that other approaches that seek to reduce the contribution of depletion region SRH to current have recently been proposed. The diffusion-driven carrier injection device architectures proposed by Oksanen and co-authors at Aalto University in Finland also reduce this contribution. Each approach has its own disadvantages: the diffusion-driven injection approach may introduce new limitations on current density at the voltages required for refrigeration and it relies on long diffusion lengths in the carrier confinement layers; the approach presented here removes most of the depletion region SRH, but still allows a small tail of the depletion region to remain. It remains to be seen which if either of these designs will help the community reach net cooling and realize the longstanding promise of LED refrigeration.

B3.2) Design Details and Performance

Table 3 shows our redesign of the baseline LED layer stack in Table 1. We change the doping on both sides of the p-n heterojunction so as to move the spatial peak of SRH recombination from the narrower bandgap light-emitting layer (GaInAsP) into the wider bandgap carrier confinement layer (InP).

To explain the design approach, we consider more closely the origin of the SRH peak that we aim to displace. At planes at which the intrinsic level crosses the mean of the quasi-Fermi levels, hereafter referred to as an active trap plane $z=z_{AT}$, the band edges are equally far from their respective quasi-Fermi levels so that their concentrations are equal. Since the full quasi-Fermi level separation qV is split evenly between the two species, each carrier species has a concentration increased from $n_i$ by a factor of $\exp((qV/2)/k_BT)$:

$$n(z=z_{AT}) = p(z=z_{AT}) = n_i \exp\left[\frac{qV/2}{k_BT}\right] = n^*(V) \quad (2)$$

As a result, as we move away from $z_{AT}$, the sum n+p=2n* that appears in the denominator of Equation (1) becomes Kn*+n*/K for some constant K. Since this expression is minimized at K=1, the $R_{SRH}$ is maximized at $z_{AT}$.

Strictly speaking the expression for n* in Equation (2) depends on the local $n_i$ within the device at equilibrium, which is only fixed material property when neither species is degenerate. This fact introduces a relatively minor correction as, at these positions, n* (V) is slightly lower but retains the same dependence on V; neglecting this will be sufficient for our present analytical discussion, but this correction is not neglected in the simulations or our quantitative conclusions.

Substituting Equation (2) into Equation (1) reveals that $$R_{SRH}(z=z_{AT}) = \frac{n_i^2\left(\exp\left[\frac{qV}{k_BT}\right]-1\right)}{\tau \cdot 2n_i\left(1+\exp\left[\frac{qV/2}{k_BT}\right]\right)} \propto \frac{n_i}{\tau} \cdot f(qV)$$

indicating that the peak value of $R_{SRH}$ is proportional to $n_i$, a quantity which is much smaller in the wider bandgap carrier confinement layer than in the narrow bandgap light-emitting layer. So long as the quasi-Fermi level difference qV is the same on both sides of the heterojunction, the reduction of $R_{SRH}$ can be expressed simply as $\exp[-\Delta E_{gap}/(2 k_BT)]$. In our case, the bandgap difference is 1.334−0.930=0.404 eV and the reduction of $R_{SRH}$ is more than 3 orders of magnitude.

TABLE 3

Layer stack for the redesigned LED.
LAYER STACK FOR REDESIGNED LED STRUCTURE

| Layer # | Thickness (nm) | Material | Doping $\|N_D-N_A\|$ (cm$^{-3}$) |
|---|---|---|---|
| 5 | 480 | p-InP | $1 \times 10^{18}$ |
| 4 | 20 | p-InP | $1 \times 10^{17}$ |
| 3 | 20 | n-GaInAsP | $1.6 \times 10^{18}$ |
| 2 | 980 | n-GaInAsP | $4 \times 10^{17}$ |
| 1 | 1300 | n-InP | $1 \times 10^{18}$ |

Figure 7A:
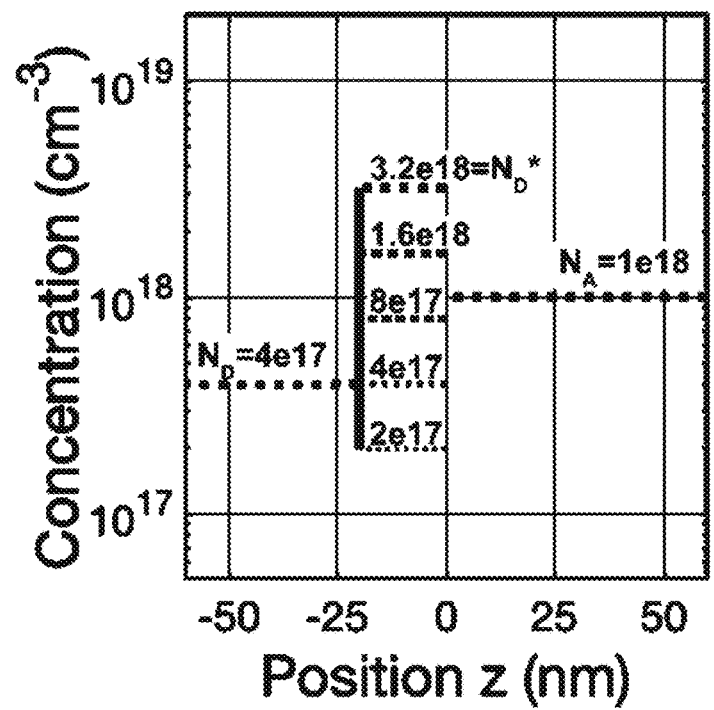
FIGS. 7A-C show the effects of varying doping concentration in a thin region near a pn heterojunction.
Figure 7B:
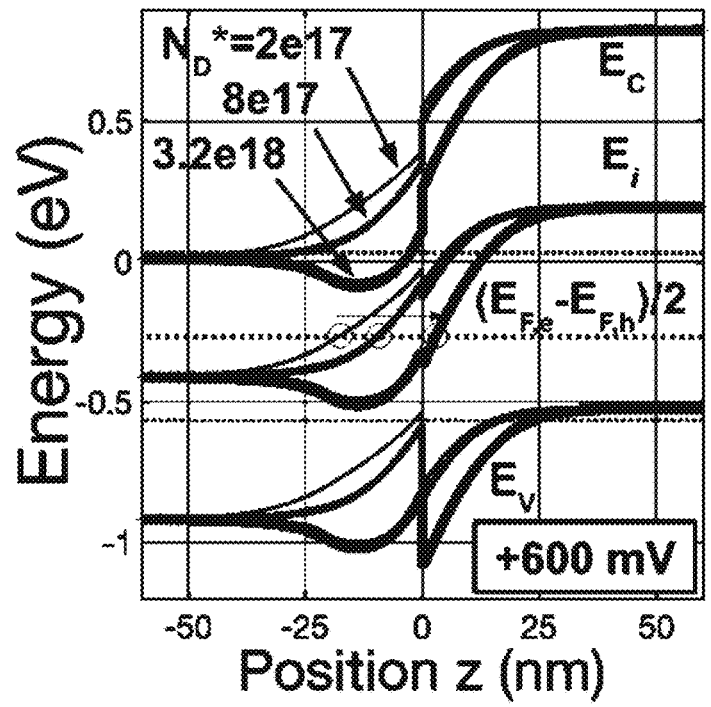
Figure 7C:
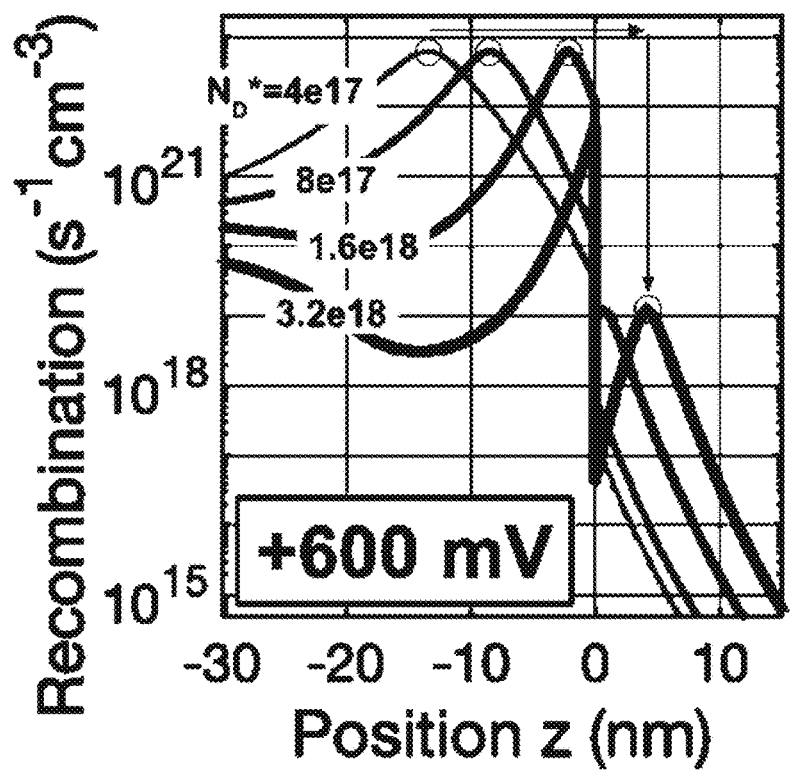

FIGS. 7A-C shows graphical depictions of the diode's changes as the donor concentration is varied within a 20 nm wide layer adjacent to the p-n heterojunction (i.e. Layer #3 in Table 1). As seen in FIG. 7A, the donor concentration $N_D*$ is varied by 16×, from 2e17 to 3.2e18 cm$^{-3}$; this results in electrostatic and charge transport changes near the junction as seen in FIG. 7B and FIG. 7C. As $N_D*$ is increased, the depletion width on n-side becomes shorter and most of the built-in voltage occurs on the p-side. As a result, the plane at which the mid-gap energy level crosses the mean of the electron and hole quasi-Fermi levels ($z=z_{AT}$) shifts toward the p-side; this crossing point is indicated by the circles in FIG. 7B. SRH recombination is maximized near this plane, and thus the sharp spatial peak in SRH recombination that affects the LED's overall efficiency is shifted across the heterojunction, resulting in a reduction of this parasitic by several orders of magnitude.

Figure 8A:
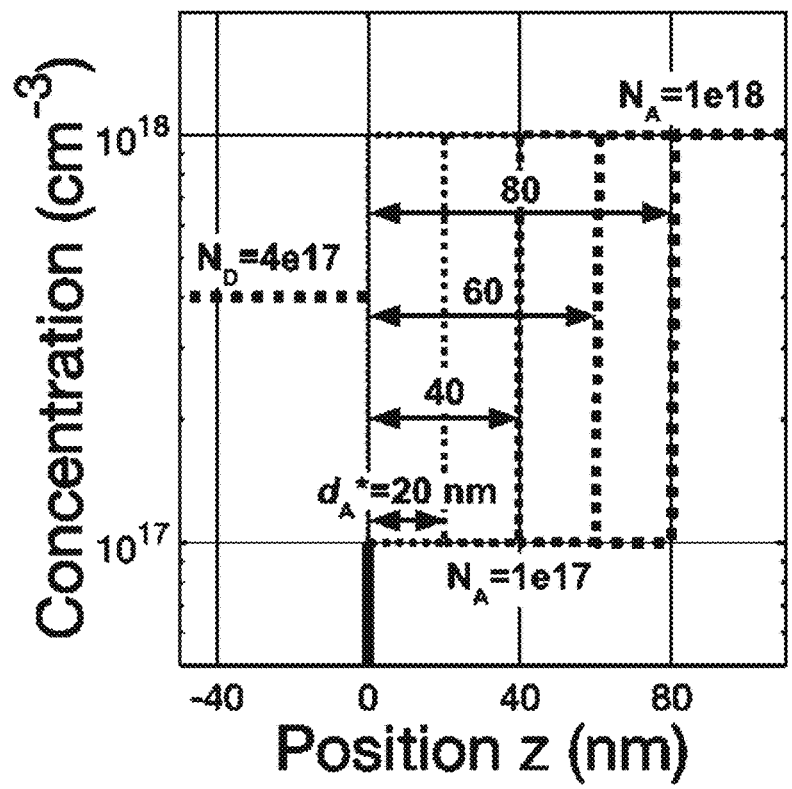
FIGS. 8A-C show the effects of varying the width of a thin region near a pn heterojunction.
Figure 8B:
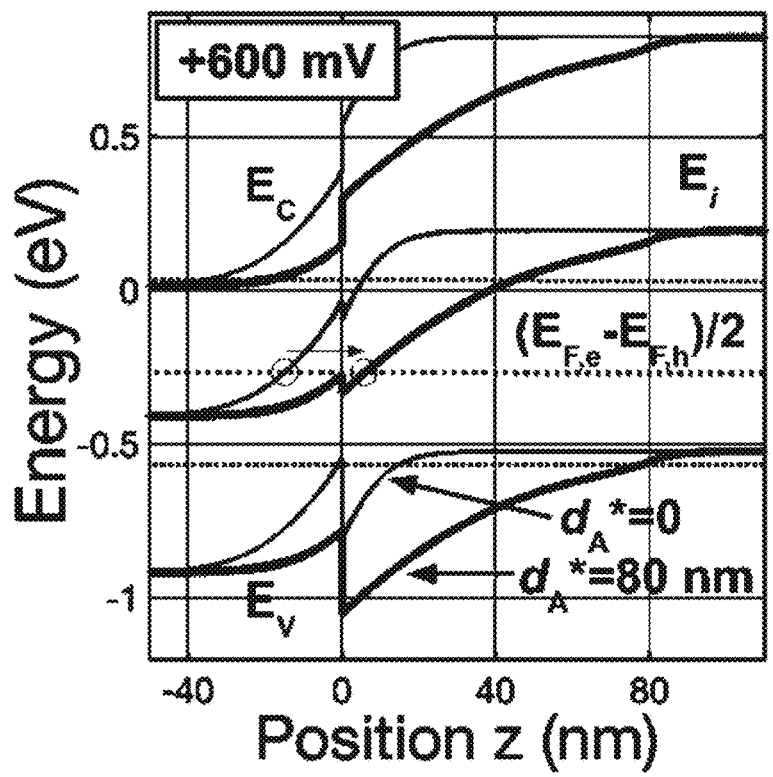
Figure 8C:
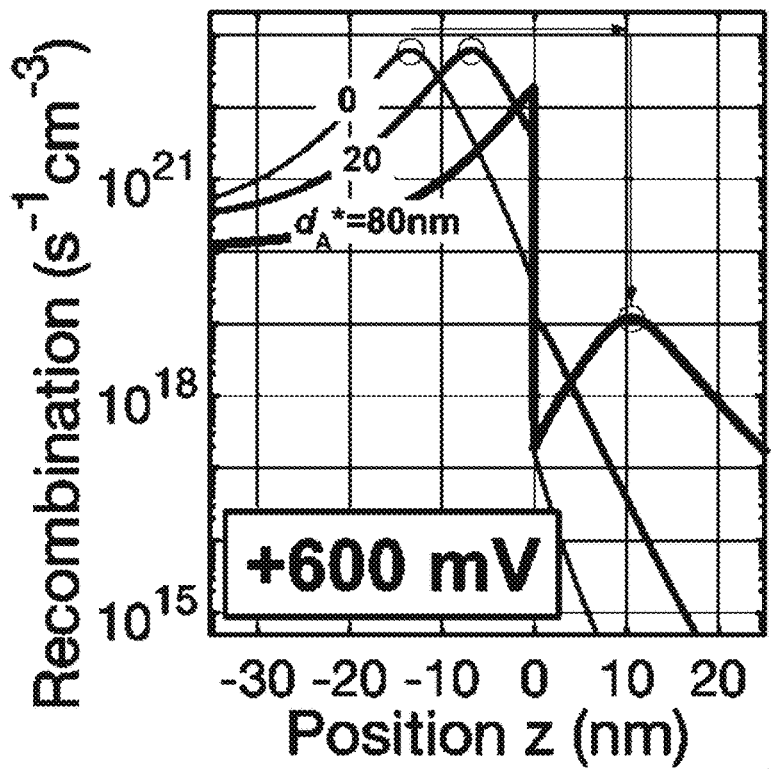

FIGS. 8A-C show graphical depictions of the diode's changes as the acceptor concentration is decreased 10-fold within a layer of variable width $d_A*$ adjacent to the p-n heterojunction (i.e. Layers #4 and #5 in Table 1). As seen in FIG. 8A, the acceptor concentration profile is varied such that the layer of reduced $N_A$ (=1e17 cm$^{-3}$ rather than the baseline 1e18 cm$^{-3}$) is widened from 0 to 80 nm; this results in electrostatic and charge transport changes near the junction as seen in FIG. 8B and FIG. 8C. As for the changes in FIGS. 7A-C, the $z=z_{AT}$ plane is shifted across the heterointerface, resulting in less total SRH recombination.

FIGS. 7A-C and 8A-C show simulation results from single changes to the baseline LED layer stack, while the design in Table 3 contains two such changes. In FIGS. 7A-C we change the magnitude of the n-doping by various amounts within a layer of fixed width. In FIGS. 8A-C we fix the magnitude of the p-doping but change the width of the layer in which this change is present. This choice is entirely arbitrary: either the width or the magnitude could be changed on either side. We choose one example of each type simply to illustrate a larger portion of the available design space.

FIG. 7A shows several possible new doping profiles which have been simulated. FIG. 7B shows the band diagrams for a subset of them, with $z=z_{AT}$ circled. For larger values of n-doping adjacent to the junction, the active trap plane shifts out of the n-GaInAsP and into the p-InP. FIG. 7C shows the consequences of this shift for the SRH recombination profile. As expected, the peak of SRH is reduced by between 3 and 4 orders of magnitude. Note that the overall impact on the non-radiative recombination rate integrated across the device becomes more significant as the voltage is reduced and the $J_{02}$ current contribution caused by this SRH peak becomes larger relative to both SRH recombination density and radiative recombination density elsewhere in the device.

FIG. 8A shows several new doping profiles in which the p-type doping of a layer adjacent to the junction is changed. FIG. 8B shows the band diagrams which result, with $z=z_{AT}$ again circled. Again we find the peak of SRH is reduced by between 3 and 4 orders of magnitude.

Note that for a small portion of the parameter space, two separate peaks in fact appear, one on each side of the heterointerface. This is a consequence of the asymmetry in the band offsets, which cause the discontinuity in the intrinsic level shown in FIGS. 7B and 8B. Although a quantitative analysis of this is not presented here, we note that the use of a heterojunction with the opposite band offset asymmetry would, for a small portion of the parameter space, remove the peak altogether. We note also that alloys which possess this property and which are lattice matched to InP are routinely utilized in InP-based devices, as illustrated in FIGS. 6A-B.

To examine the impact on LED efficiency, we choose a single point (Table 3) in the parameter space spanned by the changes analyzed in FIGS. 7A-C and 8A-C. We take the magnitude of the n-doping in the 20 nm adjacent to the junction to be $N_D*$=1.6e18 cm$^{-3}$; we choose a width $d_A*$=20 nm for the region with p-doping newly lowered to 1e17 cm$^{-3}$.

Figure 9A:
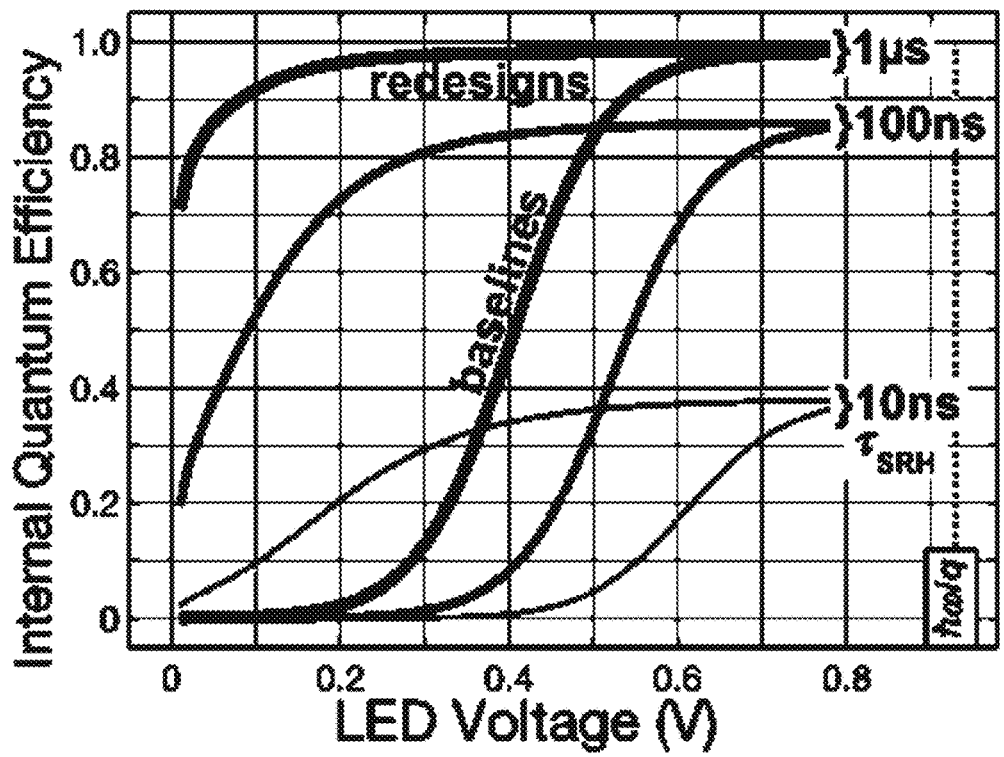
FIGS. 9A-C show quantum efficiency results for embodiments of the invention compared to conventional devices.
Figure 9B:
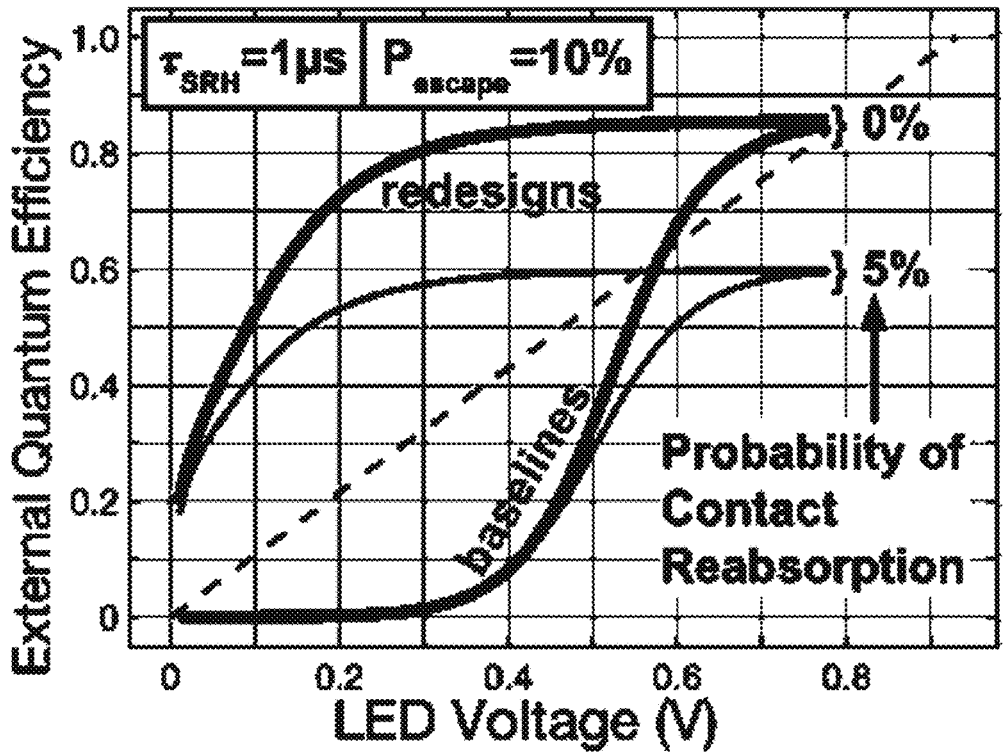
Figure 9C:
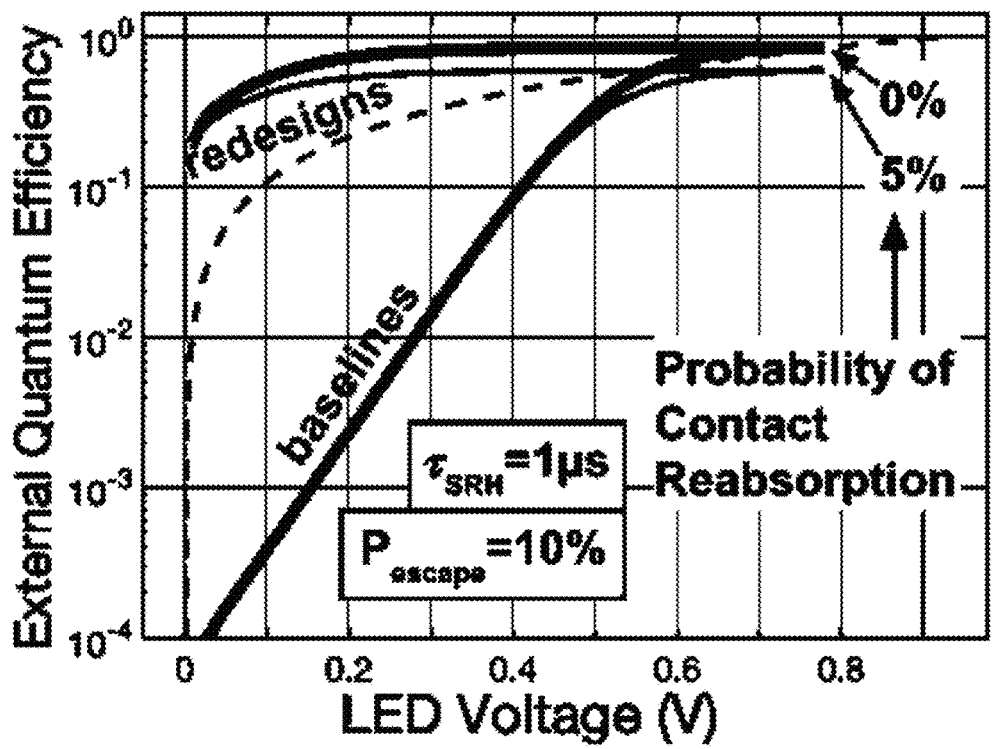

FIGS. 9A-C illustrate the impact of these design changes on the device's overall quantum efficiency. FIG. 9A reveals that the redesigned device's IQE retains its peak, previously only seen at voltages within 200 mV of the bandgap, to within a few percent at voltages as low as half the bandgap. FIGS. 9B and 9C show the EQE under plausible assumptions about the probability for a generated photon to escape ($P_{escape}$=10%), be absorbed parasitically by a contact, free carrier plasma oscillations, or other pathways leading to thermalization and retention of its energy ($P_{contact}$=0-5%), or be reabsorbed by an inter-band transition in the emitting volume ($P_{recycle}$=1−$P_{escape}$−$P_{contact}$=85-90%). The dashed lines in FIGS. 9B and 9C indicate the minimum EQE required for net LED refrigeration. We note that the baseline model in FIG. 9C bears some resemblance to previously reported experimental measurements, suggesting that a redesign of those devices' doping profiles could result in devices that indeed support refrigeration all the way down to voltages $qV \ll k_BT$, where the maximum possible efficiency diverges. Detailed modeling and fitting to experiments at these low voltages would be an interesting extension of prior work, but goes beyond the scope of the present work.

In summary, FIGS. 9A-C support the primary conclusion of our theoretical analysis: redesigning the doping profile increases quantum efficiency and may be critical to overcoming the pernicious parasitic photon absorption processes suffered by experimental efforts toward net LED refrigeration.

B3.3) The Necessity of Inhomogeneous Doping

While the preceding analysis has shown that changes to doping within the immediate vicinity of the heterojunction are sufficient to reduce the $J_{02}$ non-radiative current contribution, it begs the question of its necessity. That is, it is unclear why a homogeneous doping solution would not be sufficient. The rationale is simply that the doping of these layers are, prior to the design change, chosen for particular reasons that continue to impact device performance.

In the case of LEDs designed for refrigeration, a consensus has developed that the need for reflective contacts is well addressed by an array of point contacts on one or both of the contact terminals, separated by a low-index dielectric layer which exploits total internal reflection to raise the contact's overall reflectance. As a result, lateral current spreading is necessary, which in turn necessitates reasonably high doping in these current spreading layers to limit the newly introduced series resistance. Since the current spreads in the outer carrier-confinement layers, reducing the doping here would increase series resistance. Thus the inhomogeneous aspect of the design in FIGS. 8A-C provides a benefit over simply changing the doping of the entire micron-scale-thickness layer.

In addition to good contact reflectance, LED refrigeration also requires high IQE and low free carrier loss for emitted photons. If the design change of FIGS. 7A-C were implemented homogeneously across the entire GaInAsP active layer, the resulting increase in Auger recombination would significantly impact IQE even at the relatively low voltages considered in this analysis. Likewise, increasing photons' path length within the highly doped emitter layer by a factor of 1 μm/20 nm=50× would likely make free carriers into a substantial new parasitic absorption pathway and thereby lower the EQE.

Finally, we note that realizing the designed doping changes can face experimental challenges that could influence early experimental work to verify the theoretical analysis here. On the p-side, the diffusion of Zinc acceptors can present a hurdle. On the n-side, limited incorporation or activation of Silicon dopants could do the same. It is for these reasons that for the results shown in FIGS. 9A-C we have accounted for this risk by including doping distribution changes on both the n- and p-side simultaneously.

B4) Defect-Tolerant Photovoltaic Cell Designs

B4.1) Motivation

Photovoltaic efficiency continues to be a major driver of solar power's cost-scale learning curves even as the worldwide installed capacity approaches 1 $TW_p$. Cells composed of III-V materials can provide excellent efficiency, but are often prohibitively expensive to produce due to the cost of the substrates on which they are grown. A well-explored solution involves growth on less expensive substrates (or even complete cells) whose lattice constants differ from that of the III-V device layers. Unfortunately this lattice mismatch seeds a high extended dislocation density (EDD) which significantly degrades performance. Extensive studies in the GaInAsP quaternary [21] using diode J-V measurements, time-resolved photoluminescence (TRPL), deep level transient spectroscopy (DLTS), and a host of other materials and device characterization techniques support the interpretation of these EDDs' impact as a high density of trap states which lead to SRH recombination.

Since these EDDs pass through both the absorber layer and the depletion region of a lattice mismatched PV cell, we infer that a model with very short SRH lifetime would be representative of device performance. Motivated by this context, we implement our design principle in a model with short SRH lifetime and show that substantial improvements result, particularly for devices with highly degraded performance.

B4.2) Design Details and Performance

Table 4 shows our redesign of the baseline PV layer stack in Table 2. In analogy to the design changes for LEDs discussed in Section B3, we explore modified doping profiles near the p-n heterojunction in the baseline PV design.

Figure 10A:
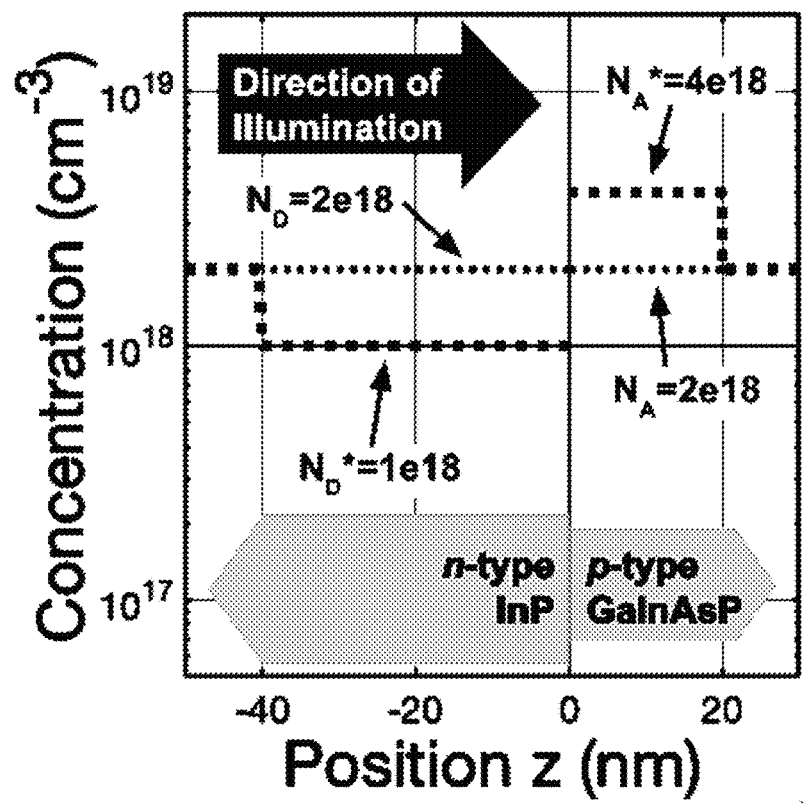
FIGS. 10A-C show photovoltaic efficiency results for embodiments of the invention compared to conventional devices.
Figure 10B:
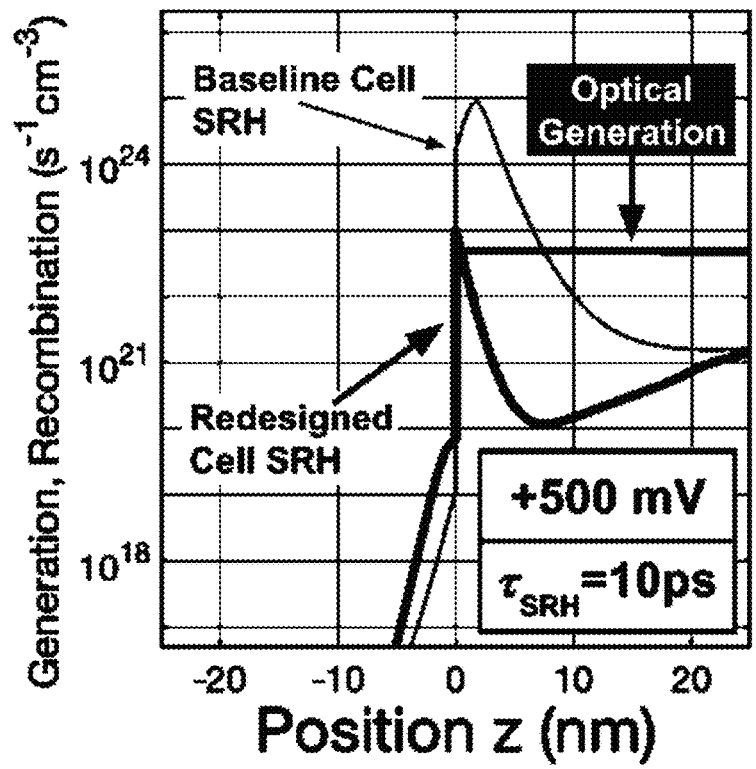

Implementing the changes (to Layers #2 and #3 from Table 2) in dopant concentration shown in FIG. 10A results in the changes in carrier recombination shown in FIG. 10B. For devices made from materials with 10 ps ($=10^{-11}$ s) SRH lifetime in all layers, the +500 mV contact boundary condition assumed in FIG. 10B is near the open-circuit voltage of the baseline cell but is well below the open-circuit voltage for the redesigned cell. A significant 25% improvement in total power and efficiency is seen for this short SRH lifetime, but the change is insignificant for cells made from higher-quality materials in which SRH is no longer the dominant recombination process. This further suggests that the design principle may have been overlooked or underutilized because of its minimal impact on high-quality cells, but that it may in fact provide a form of defect tolerance for cells grown on inexpensive lattice mismatched substrates.

Figure 10C:
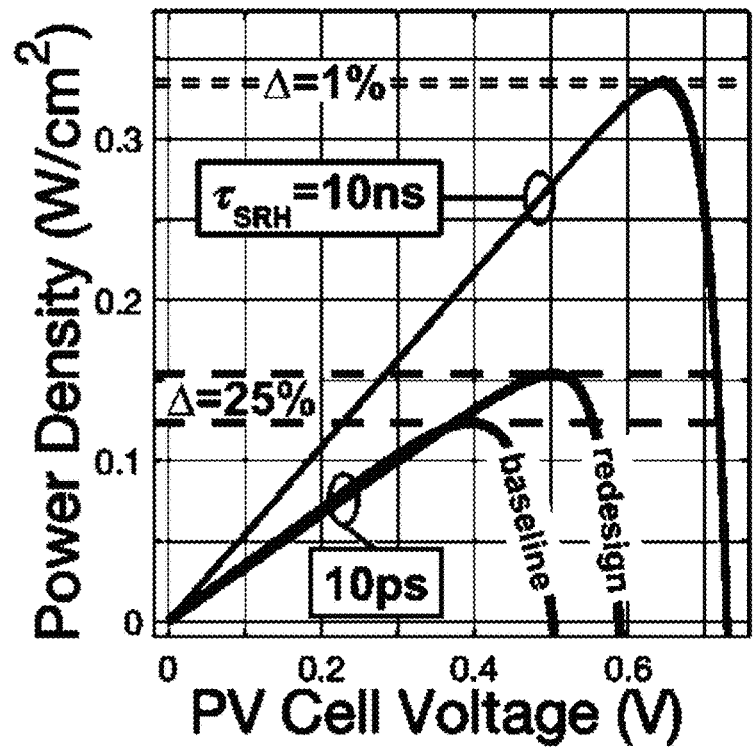

FIG. 10A shows the new doping profile. FIG. 10B shows the changes it causes to the SRH recombination profile under the assumption of a very short SRH lifetime, τ=10 picoseconds, of the scale reported in some heteroepitaxial III-V-on-Silicon PV cells. FIG. 10C shows the redesign's impact on PV performance.

TABLE 4

Layer stack for the redesigned PV and PD.
LAYER STACK FOR REDESIGNED PV AND PD STRUCTURE

| Layer # | Thickness (nm) | Material | Doping $|N_D\text{-}N_A|$ (cm$^{-3}$) |
|---|---|---|---|
| 5 | 500 | p-InP | $2 \times 10^{18}$ |
| 4 | 980 | p-GaInAsP | $2 \times 10^{18}$ |
| 3 | 20 | p-GaInAsP | $4 \times 10^{18}$ |
| 2 | 40 | n-InP | $1 \times 10^{18}$ |
| 1 | 460 | n-InP | $2 \times 10^{18}$ |

FIG. 10C indicates that the positive impact of this design change is minimal for higher quality devices with longer SRH lifetimes because other recombination processes limit their performance. For lower quality devices with shorter SRH lifetimes the impact can be significant. We note that these calculations, while qualitatively valid, significantly misrepresent the SRH timescale at which the impact of the redesign makes a clear difference. By assuming that there is no light trapping due to total internal reflection, the net radiative recombination rate is missing a carrier generation contribution that would offset its impact by as much as $4n_r^2$, where $n_r$ is the index of refraction. Given InP's refractive index of $n_r \approx 3.1$, depending on the degree of light trapping involved, an upper bound on the missing corrective factor for the radiative recombination rate would be $\approx 40$. As a result, an extremely simple device model would indicate that the transition shown in FIG. 10C from relevant to irrelevant as τ rises from 10 ps to 10 ns could be qualitatively similar but take place at a scale SRH lifetime longer by as much as a factor of $\approx 40$. Nevertheless, the essential result remains valid: redesign of the PV cell's doping distribution can suppress SRH recombination and increase its efficiency when the SRH process is the dominant carrier recombination pathway.

The improved performance of the PV cell is significant whenever the SRH process is a significant recombination pathway. This is true in several other situations besides cells with high defect densities. Low illumination levels also lead to low open-circuit voltages and similarly magnify the impact of this design strategy. Characteristic situations of potential technological relevance include the PV cells driven by indoor lighting in IoT devices and TPV cells facing heat sources with temperatures below the their optimum. For GaAs TPV cells in particular (e.g., FIG. 11), this condition may be met for temperatures well above those sufficient for lower-bandgap GaSb or GaInAs cells. Though it is beyond the scope of this work, the results here indicate that this approach could be an important method of raising the performance today's TPV systems whose performance is critically dependent on conversion efficiency at low emitter temperature.

Figure 11:
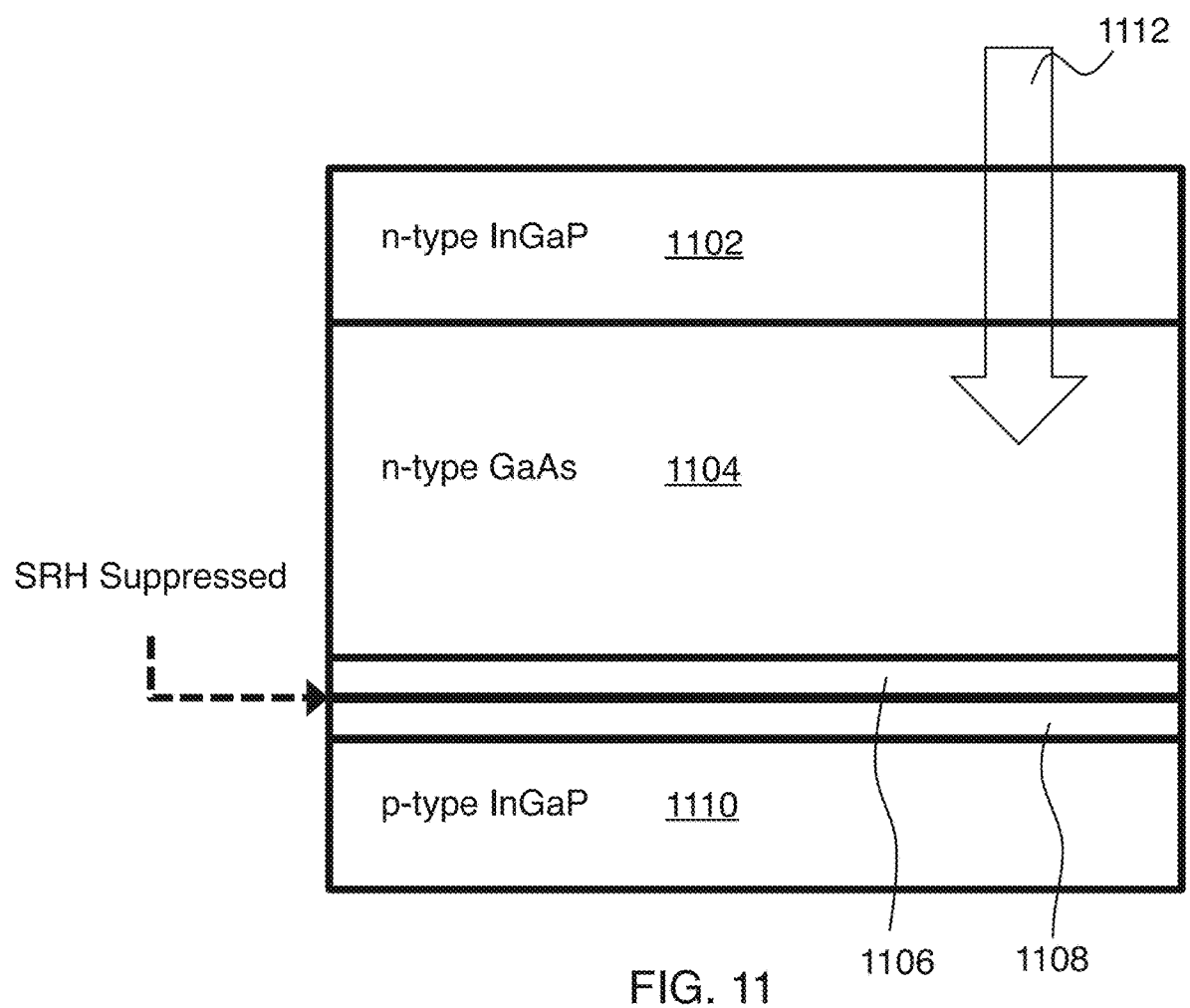
FIG. 11 shows an exemplary photovoltaic cell layer structure relating to an embodiment of the invention.

The example of FIG. 11 is a GaAs/InGaP photovoltaic cell layer structure. Here 1102 is n-type InGaP, 1104 is n-type GaAs, 1106 is n++ GaAs, 1108 is p⁻⁻ InGaP, 1110 is p-type InGaP, and 1112 schematically shows incident photons. In this example, doping regions 1106 and 1108 provide reduced SRH recombination.

B4.3) the Utility of Inhomogeneous Doping.

The case for inhomogeneous doping in III-V double heterostructure PV cell design closely resembles that made for the LEDs considered in Section B3. PV cells with higher reflectance back contacts perform more efficiently, and thus the point contact array design can be and has been used there. For thermophotovoltaics, the impact is even more significant because these back surfaces are used to reflect sub-bandgap radiation back to the heat source, where their energy is recuperated. Combined with the thermal challenges caused by additional heat loads from poor reflectance back contacts, the need for a design with a backside point contact array and its associated lateral current spreading is significant. As explained in Section B3.3, this drives the need for high conductivity in the carrier confinement layer which is at odds with the need to reduce its doping to suppress SRH recombination. An inhomogeneous doping profile allows both needs to be met simultaneously.

B5) Photo-Diode Detectors with Reduced Dark Current

B5.1) Motivation

Conventional p-i-n photodetectors are still widely used in optical communication, imaging, LiDAR, spectroscopy, and elsewhere. A device design with reduced dark current or increased zero-bias resistance could give photodetectors in these systems better performance. For instance, long-haul fiber communications benefit from improved sensitivity at the receiver side of these links and a recent analysis indicates that detector performance also plays an important role in energy efficiency for short-range optical communication links.

For near- and mid-infrared detectors, noise is often reduced through active cooling, for example by thermoelectric modules. Designs which lower dark current and raise zero-bias resistance could reduce or eliminate the need for these bulky, heavy, power-hungry, heat-generating thermoelectric systems. One highly relevant example is the extended-InGaAs detector (e.g., as shown on FIG. 12), grown lattice mismatched on InP, and sensitive out to 2.5 μm. This detector type is notoriously noisy as the result of the material flaws caused by threading dislocations from the lattice mismatch. As with the results in Section B4, the design strategy in this work is particularly well-suited to these high defect density devices because their materials' SRH lifetimes are short and thus more limiting to their performance.

Figure 12:
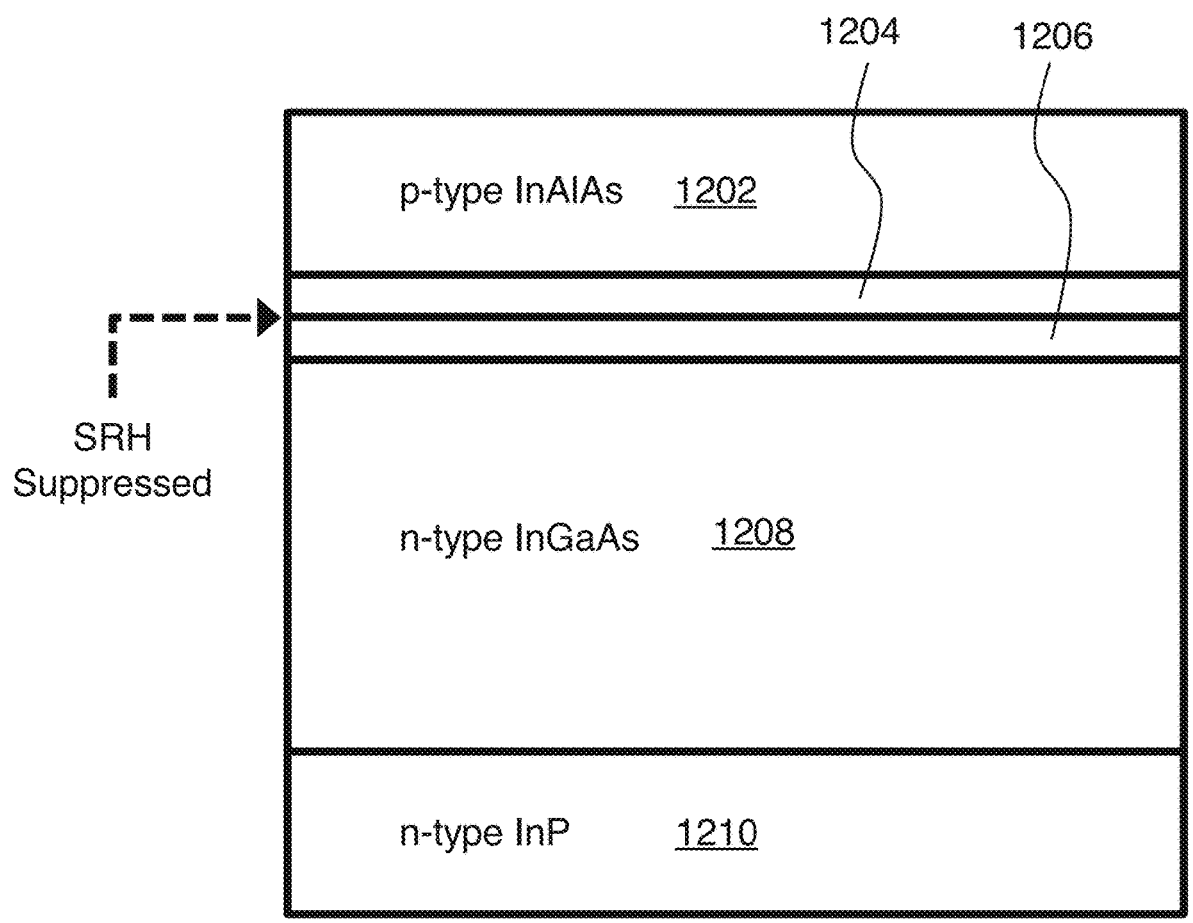
FIG. 12 shows an exemplary extended InGaAs photodetector layer structure relating to an embodiment of the invention.

The example of FIG. 12 is an extended InGaAs photodetector layer structure. Here 1202 is p-type InAlAs, 1204 is p⁻⁻ InAlAs, 1206 is n++ extended InGaAs, 1208 is n-type extended InGaAs (e.g., having a 0.5 eV band gap which results in a lattice mismatch to InP), and 1210 is n-type InP. In this example, doping regions 1204 and 1206 provide reduced SRH recombination.

B5.2) Design Performance

Figure 13A:
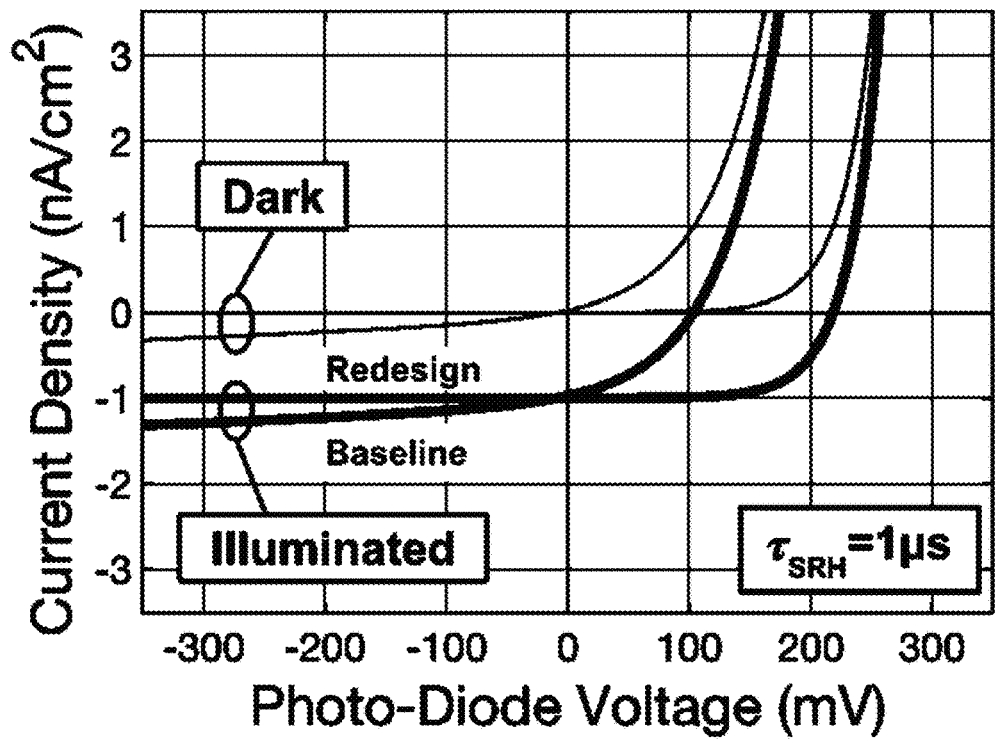
FIGS. 13A-B show photodetector performance results for embodiments of the invention compared to conventional devices.
Figure 13B:
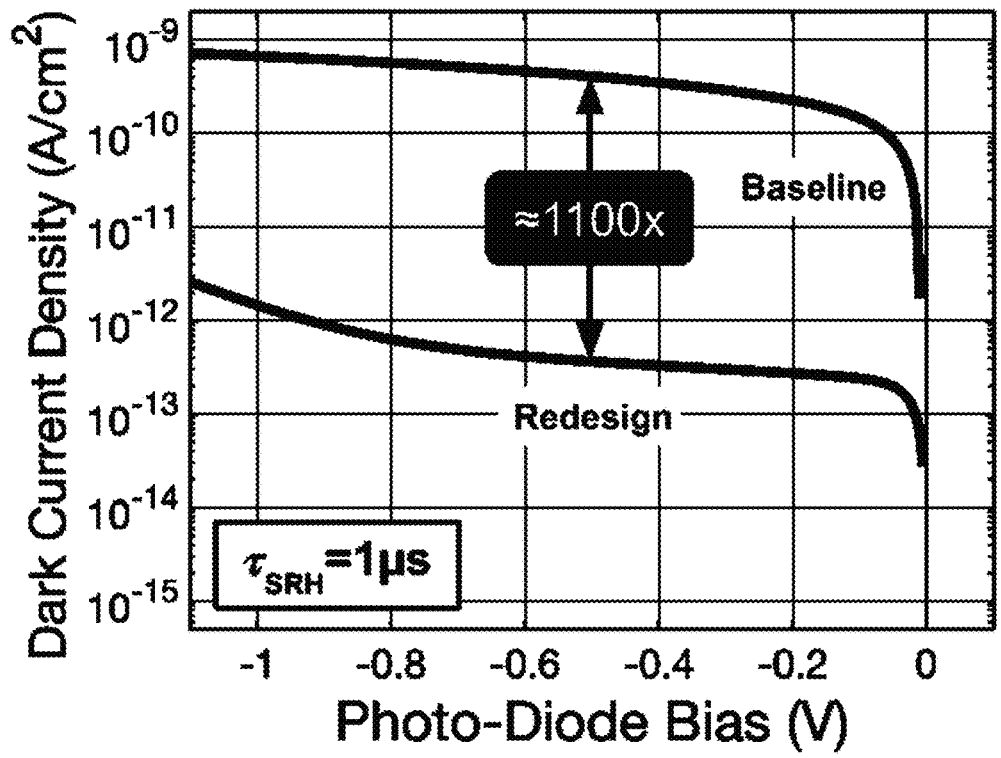

Both for simplicity and to clarify how the PV result in Section 4 changes as the illumination level is reduced, we consider here the same pair of structures, described in Tables 2 and 4, as in the PV cell analysis. The result is depicted in FIGS. 13A-B. The redesigned device exhibits both much lower dark current and much higher zero-bias resistance.

Figure 14A:
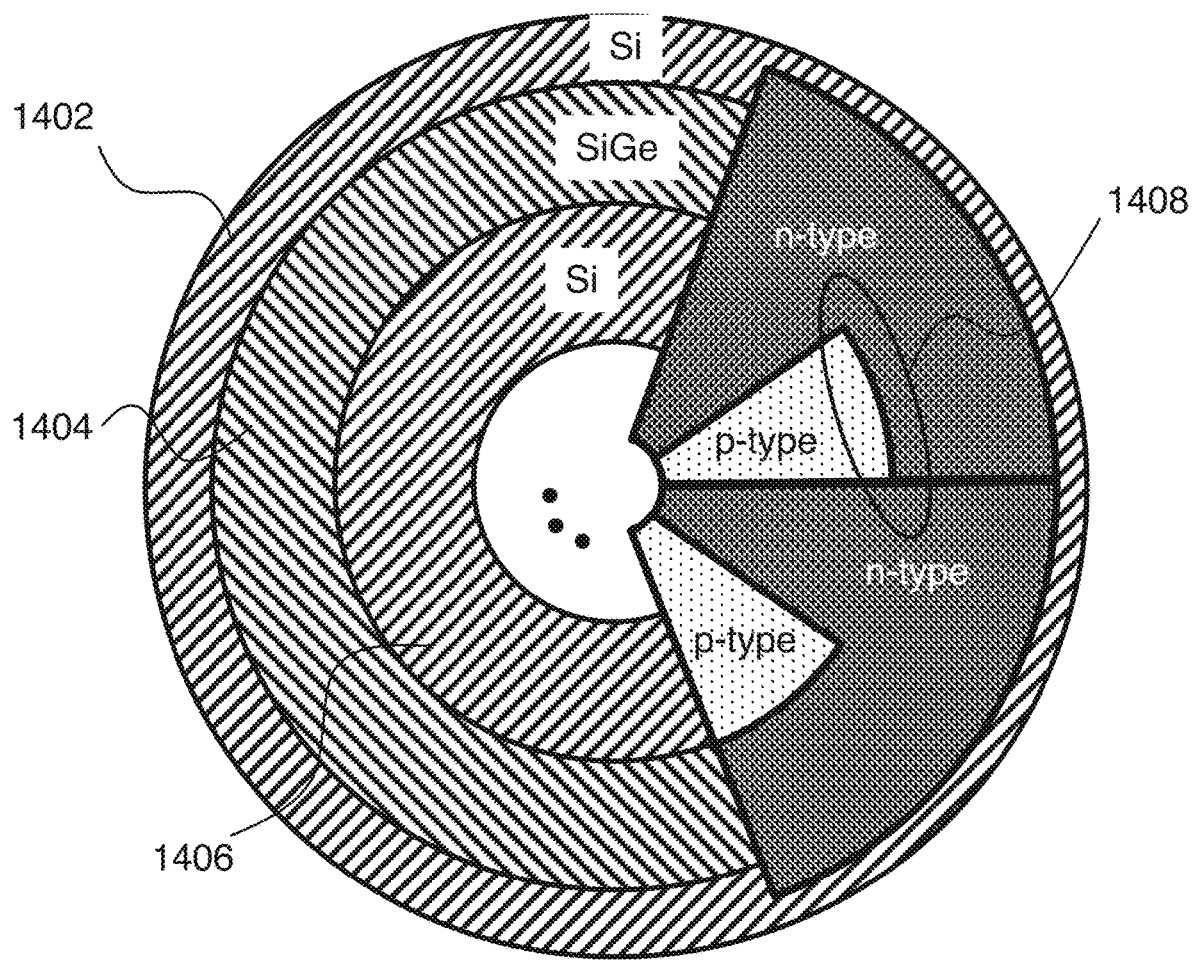
FIGS. 14A-B show an exemplary ring detector structure relating to an embodiment of the invention.
Figure 14B:
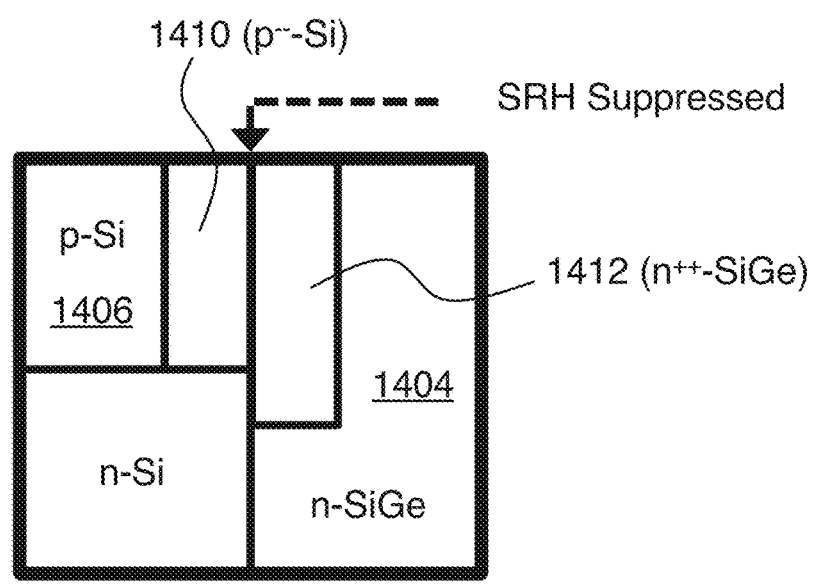

Another exemplary photodetector structure is the ring detector of FIGS. 14A-B. Here FIG. 14A is a top view and FIG. 14B is an enlarged radial-vertical cross section view of region 1408. Annular regions 1402, 1404, 1406 can have compositions as shown, and radial sectors of the resulting structure can be doped as shown in the right side of FIG. 14A.

In reverse bias operation, the detector circuit's noise floor is commonly set by the dark current, for signals above the shot noise limit. The carrier generation processes that lead to this current act as a noisy current source at the circuit level. The relevant measure of improvement in dark current performance is not the linear difference between its value at a given reverse bias but the ratio of its value in the two designs, since the latter is what determines the signal-to-noise ratio. This ratio is shown in FIG. 13B.

In photovoltaic or zero-bias operation, the detector circuit's noise floor is commonly set by the Johnson noise resulting from the finite differential resistance of the diode at this operating point. The zero-bias resistance-area product of the baseline design was found to be 336 MΩ-cm², while that of the redesigned device's was 100 GΩ-cm². This improvement of $\approx 300$ in resistance-area product corresponds to a reduction of the detector circuit's noise current of $\approx 17\times$.

C) Experimental Example

Suppression of SRH generation and/or recombination as described above has been investigated experimentally. In one experiment Gallium-Indium-Arsenide-Phosphide LEDs emitting at a free-space wavelength of 1330 nm were fabricated by a combination of epitaxial Metal-Organic Chemical Vapor Deposition growth, wet chemical etching, and contact metal evaporation.

The epitaxial structures were grown lattice-matched to their Indium Phosphide substrate wafers according to the specification in Table 5. Design A is a modified double hetero-junction layer stack which utilizes an inhomogeneous doping profile to displace the depletion region out of the GaInAsP and into the adjacent InP layer. This is intended to reduce SRH generation and/or recombination according to the above-described principles. Design B serves as a control.

TABLE 5

Epitaxial layer structures for the experiment of FIG. 15.

| Thickness (nm) | material | Design A doping $cm^{-3}$ | Design B doping $cm^{-3}$ |
|---|---|---|---|
| 480 | p-InP | 1e18 | 1e18 |
| 20 | p-InP | 1e17 | 1e18 |
| 20 | n-GaInAsP | 2.26e18 | 4e17 |
| 980 | n-GaInAsP | 4e17 | 4e17 |
| 50 | n-InP | 4e17 | 4e17 |
| 1250 | n-InP | 2e18 | 2e18 |
| 200 | n-InP | 1e18 | 1e18 |
| ≈370 μm | i-InP | semi-insulating | semi-insulating |

Figure 15A:
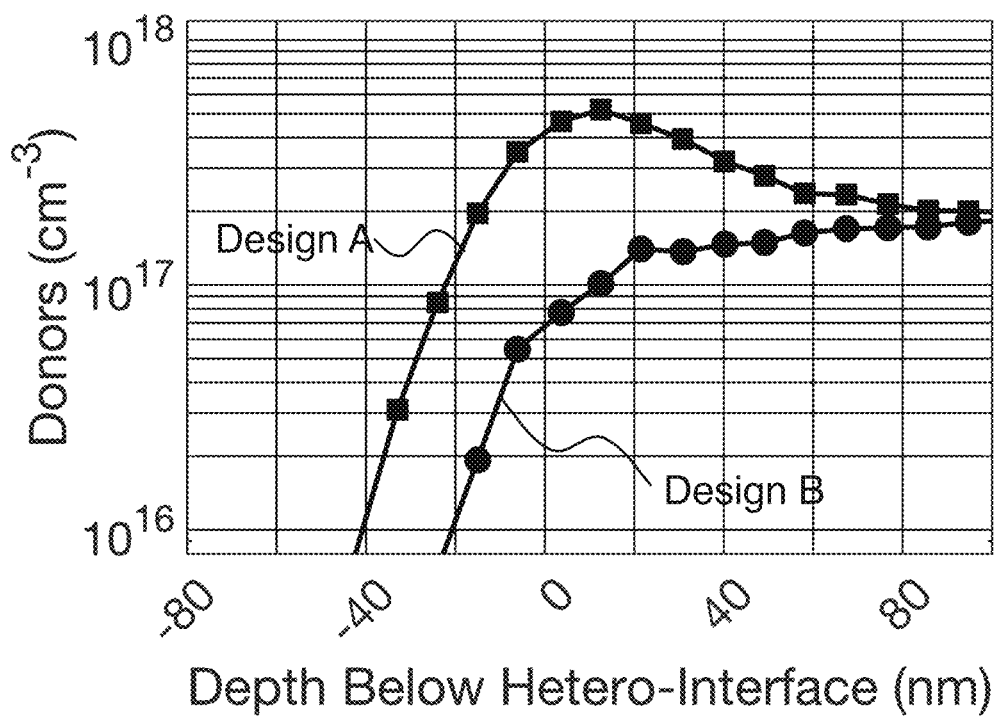
FIGS. 15A-B shows experimental results relating to an embodiment of the invention.

Some variation between epitaxial layer specifications and real as-grown material results are to be expected. FIG. 15A shows Secondary Ion Mass Spectrometry measurements of the donor impurity concentration versus depth across the plane of the hetero-junction for both designs. The sample grown according to Design A (squares) has a markedly larger concentration of donors within the first 20 nm of the hetero-junction than the Design B sample (circles). The electrostatics of this junction may be reasonably expected to implement the above-described principles for reducing recombination.

Figure 15B:
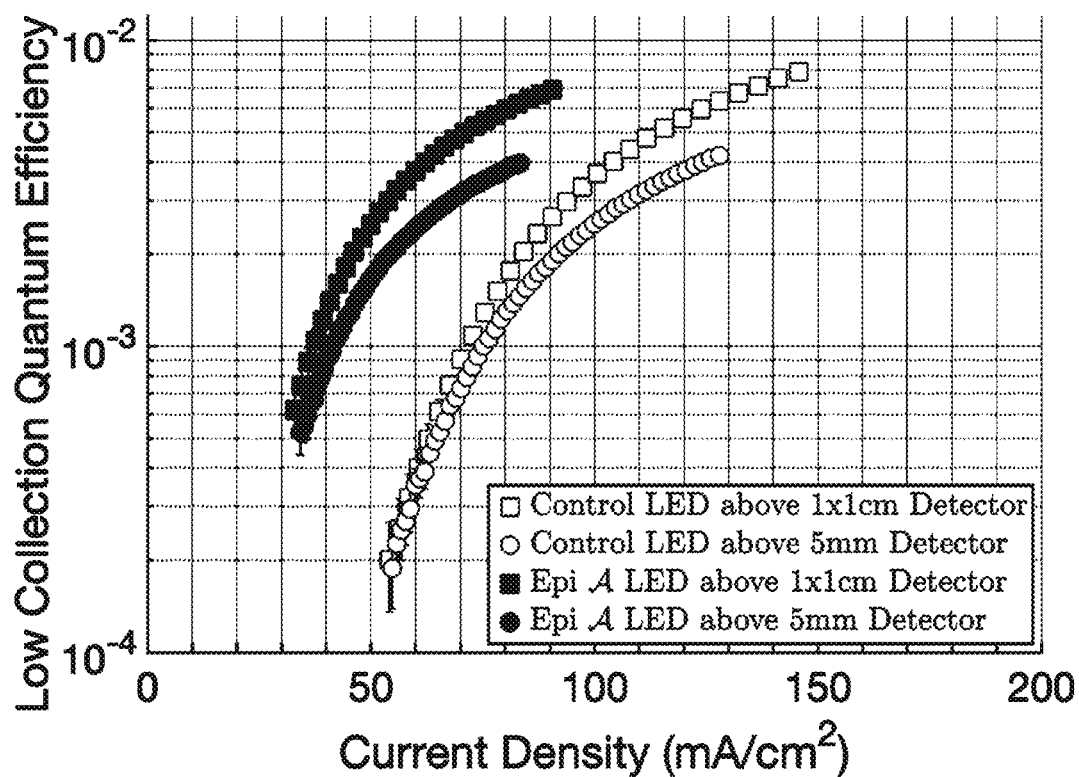

FIG. 15B presents data taken on 8 mm² diodes at voltages ranging from 500 mV to 920 mV, the upper limit of which is near the bandgap voltage of the LED's emitting layer. The figure indicates that the epitaxial layer stack design change from Design B to Design A resulted in less current leaking through the device as intended. The decrease in current for a given quantum efficiency is seen to be ≈2×. This indicates moderate suppression of non-radiative recombination at low current density.

The invention claimed is:

1. Apparatus comprising:
   a first semiconductor material;
   a second semiconductor material having a larger band gap than the first semiconductor material;
   wherein a heterojunction is formed at a composition interface between the first semiconductor material and the second semiconductor material;
   wherein dopant impurities are present at or near the composition interface to create a p-n junction having a doping interface;
   wherein a doping profile of the dopant impurities at or near the composition interface is configured to preferentially shift Shockley-Read-Hall (SRH) generation and/or recombination into the second semiconductor material.

2. A light emitting diode including the apparatus of claim 1, wherein a band gap of the first semiconductor material is in a range from 0.7 eV to 5 eV.

3. A solar photovoltaic device including the apparatus of claim 1, wherein a band gap of the first semiconductor material is in a range from 1.1 eV to 1.9 eV.

4. A thermo-photovoltaic device including the apparatus of claim 1, wherein a band gap of the first semiconductor material is in a range from 0.5 eV to 1.45 eV.

5. A photodetector including the apparatus of claim 1, wherein a band gap of the first semiconductor material is in a range from 0.5 eV to 1.2 eV.

6. The apparatus of claim 1, wherein $V_{gap}$ is a voltage corresponding to an energy band gap of the first semiconductor material, wherein $V_{thermal}$ is a thermal voltage, and wherein the apparatus is included in a diode configured to be operated in a forward bias voltage range from $V_{gap}/2$ to $V_{gap}-3V_{thermal}$.

7. The apparatus of claim 1, wherein the heterojunction is a type I heterojunction.

8. The apparatus of claim 1, wherein the heterojunction is a type II heterojunction.

9. The apparatus of claim 1, wherein a conduction band discontinuity of the heterojunction is less than a valence band discontinuity of the heterojunction, wherein the second material is doped n-type and wherein the first material is doped p-type.

10. The apparatus of claim 1, wherein a conduction band discontinuity of the heterojunction is greater than a valence band discontinuity of the heterojunction, wherein the second material is doped p-type and wherein the first material is doped n-type.

11. The apparatus of claim 1, wherein the doping profile includes a first region of the first material at or near the composition interface and having a larger doping concentration than an adjacent part of the first material.

12. The apparatus of claim 11, wherein a thickness of the first region is 50 nm or less.

13. The apparatus of claim 1, wherein the doping profile includes a second region of the second material at or near the composition interface and having a smaller doping concentration than an adjacent part of the second material.

14. The apparatus of claim 13, wherein a thickness of the second region is 200 nm or less.

15. The apparatus of claim 1, wherein the doping interface coincides with the composition interface.

16. The apparatus of claim 1, wherein the doping interface is separated from the composition interface by 100 nm or less.

17. The apparatus of claim 1, wherein the doping profile is graded at a location of the doping interface.

* * * * *